(12) United States Patent  
Nicolaidis

(10) Patent No.: US 7,073,102 B2  
(45) Date of Patent: Jul. 4, 2006

(54) RECONFIGURATION DEVICE FOR FAULTY MEMORY

(75) Inventor: Michaël Nicolaidis, Saint Egreve (FR)

(73) Assignee: LROC Technologies, Grenoble (FR)

( * ) Notice: Subject to any disclaimer, the term of this patent is extended or adjusted under 35 U.S.C. 154(b) by 413 days.

(21) Appl. No.: 10/286,686

(22) Filed: Nov. 1, 2002

(65) Prior Publication Data

US 2004/0059974 A1 Mar. 25, 2004

(30) Foreign Application Priority Data

Jul. 31, 2002 (FR) .................................. 02 09762

(51) Int. Cl.  
*G11C 29/00* (2006.01)
(52) U.S. Cl. .................... 714/718; 714/42; 714/724
(58) Field of Classification Search ................ 714/718, 714/7, 711, 710, 730, 735, 736, 724, 29, 42; 365/201  
See application file for complete search history.

(56) References Cited

U.S. PATENT DOCUMENTS

| 5,293,348 A | 3/1994 | Abe |
| 5,303,192 A | 4/1994 | Baba |
| 5,781,717 A | 7/1998 | Wu et al. |
| 6,085,334 A * | 7/2000 | Giles et al. ..................... 714/7 |
| 6,327,680 B1 * | 12/2001 | Gervais et al. ............. 714/711 |
| 6,345,373 B1 * | 2/2002 | Chakradhar et al. ........ 714/738 |
| 6,829,736 B1 * | 12/2004 | Marinissen et al. ......... 714/711 |
| 2002/0141260 A1 * | 10/2002 | Wu et al. ................... 365/201 |

FOREIGN PATENT DOCUMENTS

WO  WO 01/16955 A1  3/2001

* cited by examiner

*Primary Examiner*—Albert Decady  
*Assistant Examiner*—Fritz Alphonse  
(74) *Attorney, Agent, or Firm*—Erwin J. Basinski

(57) ABSTRACT

A device for reconfiguring faults in a circuit comprised of several units and comprising storage means for storing the fault locations, connection/disconnection means for disconnecting faulty units and connecting in their place fault-free units, and means for generating control signals of the connection/disconnection means, responding to the content of the storage means. According to this method, each unit is divided into several portions; in a test phase, fault tests are carried out for the different units, and the test results of the different portions of the units are stored in the storage means; and in a use phase aiming at the use of given unit portions, said control signals are determined by the content of the storage means corresponding to these unit portions.

5 Claims, 14 Drawing Sheets

RECONFIGURATION DEVICE FOR FAULTY MEMORY

This application claims priority benefit of French Patent Application No. 02/09762, filed Jul. 31, 2002.

BACKGROUND OF THE INVENTION

1. Field of the Invention

The present invention relates to a reconfiguration device for a set of W memory units associated with k replacement units or redundant units.

2. Discussion of the Related Art

The applicant has described in patent application PCT/FR02/00523 devices for automatic rerouting between access terminals and fault-free blocks (or units), that is, the faulty memory blocks are replaced with other blocks selected, according to cases, among the neighbors of the faulty block (case of FIG. 1A) or directly among redundant blocks (case of FIG. 1B). In practice, these will be memory blocks, each of which provides a data bit of a 16-, 32- or 64-bit word. In the case of a memory with 32-bit words, 8 redundant blocks will for example have to be added.

FIG. 1A illustrates in a very simplified manner a memory having words of N (four) bits. Each of the bits of the different memory words is stored in a unit of $2^m$ cells (where m is the number of address bits of each memory unit). There thus are W (four) base units of memory cells $U_0$ to $U_3$ and k (three) replacement units $U_4$ to $U_6$. In this example, the number of address bits of each unit is equal to the number of address bits of the memory and W=N, since the unit of the memory considered herein corresponds to the block which comprises all the cells generating a data bit. To perform a replacement, instead of connecting the data input/output terminals $d_0$, $d_1$, $d_2$, $d_3$ directly to memory units $U_0$, $U_1$, $U_2$, $U_3$, it is provided to connect these terminals to the memory units via multiplexers $MUX_0$, $MUX_1$, $MUX_2$, $MUX_3$, respectively controlled by the outputs of a logic reconfiguration circuit RFL associated with W+k=N+k flip-flops $F_0$ to $F_{N+k-1}$ ($F_0$ to $F_6$) in which, during a previous test phase, the right or erroneous state of the corresponding unit has been indicated. In the case where there are k replacement units, each multiplexer will have k+1 outputs. It should be noted that this multiplexer must be bidirectional to be able to connect the data terminals to the memory blocks during the reading and the writing, or else two multiplexers will be used, one for the reading and one for the writing.

In the embodiment of FIG. 1A, it is provided to replace each faulty memory block with its closest fault-free memory block. A "close" substitution is performed. Each multiplexer is capable of being connected to the unit of same rank and to the three units of immediately greater rank.

In the embodiment of FIG. 1B, any erroneous unit is replaced, not with one of its non-erroneous neighbors, but with one of the replacement units. A "distant" substitution is performed. Each multiplexer comprises an output to the corresponding unit and three outputs to units $U_4$ to $U_6$.

To determine to which unit the rerouting must be performed, account must be taken of the state of the already examined units, for example, those located to the right (or to the left) of a considered unit, and of the state of the possible replacement units. Patent application PCT/FR02/00523 describes various means for automatically performing this rerouting once the erroneous units have been identified by the testing.

FIG. 2 illustrates in a logic and simplified manner the system of FIGS. 1A and 1B. The inputs/outputs of a memory comprising W+k=N+k units ($U_0$ to $U_{N+k-1}$) are associated with W=N multiplexers of 1 from among k+1 ($MUX_0$ to $MUX_{N-1}$) connected to N input/output terminals (I/O). Each multiplexer receives k+1 control signals from a logic reconfiguration circuit RFL coupled to W+k=N+k defect location storage cells $FLSC_0$ to $FLSC_{N+k-1}$.

The repair process described hereabove may be called a static process. A memory being divided into a number of blocks, each of which provides one data bit, a number of redundant blocks intended to replace erroneous memory blocks is provided. Once the memory and the replacement blocks have been tested, the reconfiguration of the outputs between the base blocks (or regular blocks) and the replacement blocks is definitively performed (or programmed). In a memory with 32-bit words, to repair 8 faults distributed in 8 blocks, 8 redundant blocks must be provided. Then, the surface area taken up by the replacement blocks is equal to one quarter of the surface area of the base blocks.

SUMMARY OF THE INVENTION

An object of the present invention is to reduce the surface area taken up by the redundant blocks.

For this purpose, the present invention provides a dynamic repair mode which reduces the number of replacement blocks and/or their dimensions.

More specifically, the address space of a memory will be divided into address space subsets; the fault tests and the repair modes will be carried out specifically for each address sub-assembly, whereby same replacement units can be used to, repair faults existing in different base blocks.

To achieve these objects, the present invention provides a method for repairing faults in a circuit comprised of several units and comprising storage means for storing the fault locations, connection/disconnection means for disconnecting from the rest of the system faulty units and connecting in their place fault-free units, and means for generating control signals of the connection/disconnection means, responding to the content of the storage means, the value of the control signals determining the units which will be disconnected and the units which will be connected instead of them. According to this method:

each unit is divided into several portions, in a test phase, fault tests are carried out for the different units, and the test results of the different portions of the units are stored in the storage means, and in a use phase aiming at the use of given unit portions, said control signals are determined by the content of the storage means corresponding to these unit portions.

According to an embodiment of the present invention, the circuit is a memory.

According to an embodiment of the present invention, each unit contains at most $2^m$ elements selected by m address bits, each unit is divided into several portions each containing all the elements of the selected unit when r address bits take a given value, and the m−r other address bits take all possible values, the results of the fault tests of the different portions of each unit are stored in distinct storage means, selected by the current value of the r address bits, and in a use phase, said control signals are determined by the content of the distinct storage means, selected by the current value of the r address bits.

According to an embodiment of the present invention, applied to a memory with W base units and k redundant units, each base unit comprises at most $S=2^s$ identical portions, selected by s address bits, z redundant units ($z \geq 0$, k−z>0) each comprise the same number of portions, of same size, as the base units, selected by s address bits, k−z redundant units each comprise at most $T=2^t$ portions of same size as the base units, selected by t address bits which form a subset of the s address bits, the results of the fault tests of each portion of the k−z redundant units are stored in at most $P=2^p$ distinct sets of storage means, selected by p address bits which form a subset or superset of the t address bits, with p=t+c, c being a negative, positive or zero integer, such that $p \geq 0$, the results of the fault tests of each portion of the base units and of the z redundant units are stored in at most $R=2^r$ distinct sets of storage means, selected during the test phase by r address bits which form a superset or subset of the s address bits, with r=s+c, and said control signals are a function of the p address bits and of at most $P=2^p$ groups of intermediary control signals, each group of the intermediary control signals being a function of:

the content of all the storage means affecting the k−z redundant units, selected in the test phase by a value of the p address bits, at most $U=2^{r-p}$ sets of means for storing the locations of the faults affecting the base units and the z redundant units, selected during the test phase by the same value of the p address bits, and u from among the r address bits other than the p address bits (u=r−p).

According to an embodiment of the present invention, applied to a memory with W base units and k redundant units, each base unit comprises a set of memory cells connected, in the absence of faults, to the same data bit, and each redundant unit comprises the same number of cells as a base unit.

According to an embodiment of the present invention, applied to a memory with W base units and k redundant units, each base unit comprises a set of memory cells connected, in the absence of faults, to the same data bit.

According to an embodiment of the present invention, applied to a memory with W base units and k redundant units, the redundant units are selected by k selection/deselection units, and the connection/disconnection control means are controlled by k control signals and generate the k signals of selection/deselection of the redundant units and signals of selection/deselection of the regular units.

According to an embodiment of the present invention, the storage means consist of a CAM comprising groups of k w-bit words, in test phase d, the value of r address bits selects a group of k words, and upon each fault detection, the value of the w address bits is stored in a word of the selected group, during use of the memory, the value of the r address bits selects a group of k words, the current value of the w address bits is compared with the content of the words of the CAM to activate a matching signal for each word containing the current value of the w address bits, the control signals are a function of the matching signals of the word groups of the CAM selected by the current value of the r address bits.

According to an embodiment of the present invention, applied to a memory with W base units and k redundant units, the base units are selected by W selection signals and the redundant units are selected by k selection signals, the elements of each base unit are memory words selected by m address bits, the elements of each redundant unit are memory words selected by m−c address bits, the connection/disconnection means receive k control signals and W signals generated by a circuit which decodes w address bits, and generate the W selection signals of the base units and the k selection signals of the redundant units, the storage means consist of a CAM comprising several groups of k w+r-bit words, in the test phase, the current value of the w+r address bits is stored in a word of the CAM upon each fault detection, during the memory operation, the current value of the w+r address bits is compared with the content of all the words in the CAM to activate a matching signal for each word containing the value of the w+r address bits, the control signals are a function of the matching signals of the CAM, and the redundant units are addressed by m−r base address bits of the RAM and by r−c bits generated from the matching bits of the CAM.

According to an embodiment of the present invention, the $S=2^s$ portions of the base units and the $T=2^t$ portions of the redundant units are columns respectively selected by s and t address bits, p=0, P=1, the control signals, determining the connection of the base units to the data bits, are a function of the r address bits, of the content of all the means for storing locations of the faults in the redundant units, and of the content of the $U=R=2^r$ sets of means for storing fault locations in the base units, the connection of each base block to the corresponding data bit is established for each write operation, the control signals, determining the connection of the replacement bits to the data bits, are a function of the content of all the means for storing locations of the faults in the redundant units, and of the content of the $U=R=2^r$ sets of means for storing fault locations in the base units, and the connection of the replacement blocks to the data bits is made by a multiplexer controlled by signals which are a function of the content of all the means for storing locations of the faults in the redundant units, and of the content of the $U=R=2^r$ sets of means for storing fault locations in the base units.

The foregoing objects, features and advantages of the present invention will be discussed in detail in the following non-limiting description of specific embodiments in connection with the accompanying drawings.

DETAILED DESCRIPTION

First Embodiment of the Present Invention

Figure 2:
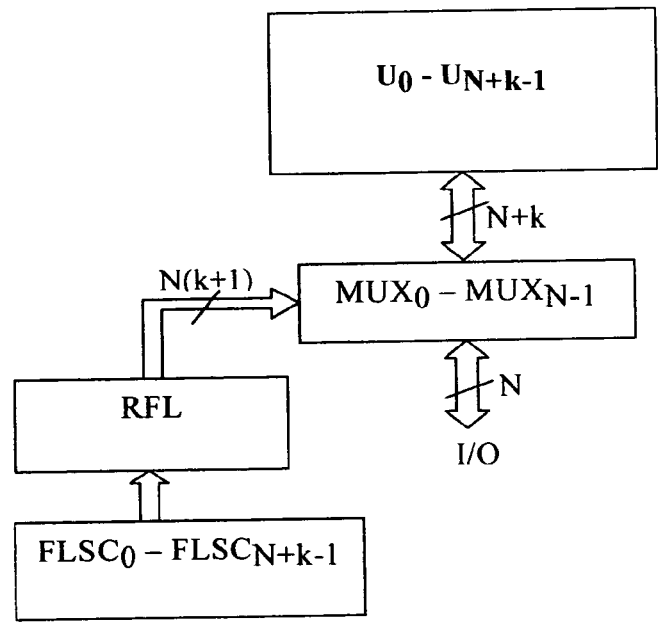
FIG. 2 shows in a logic simplified manner a static reconfiguration architecture according to prior art.
Figure 3:
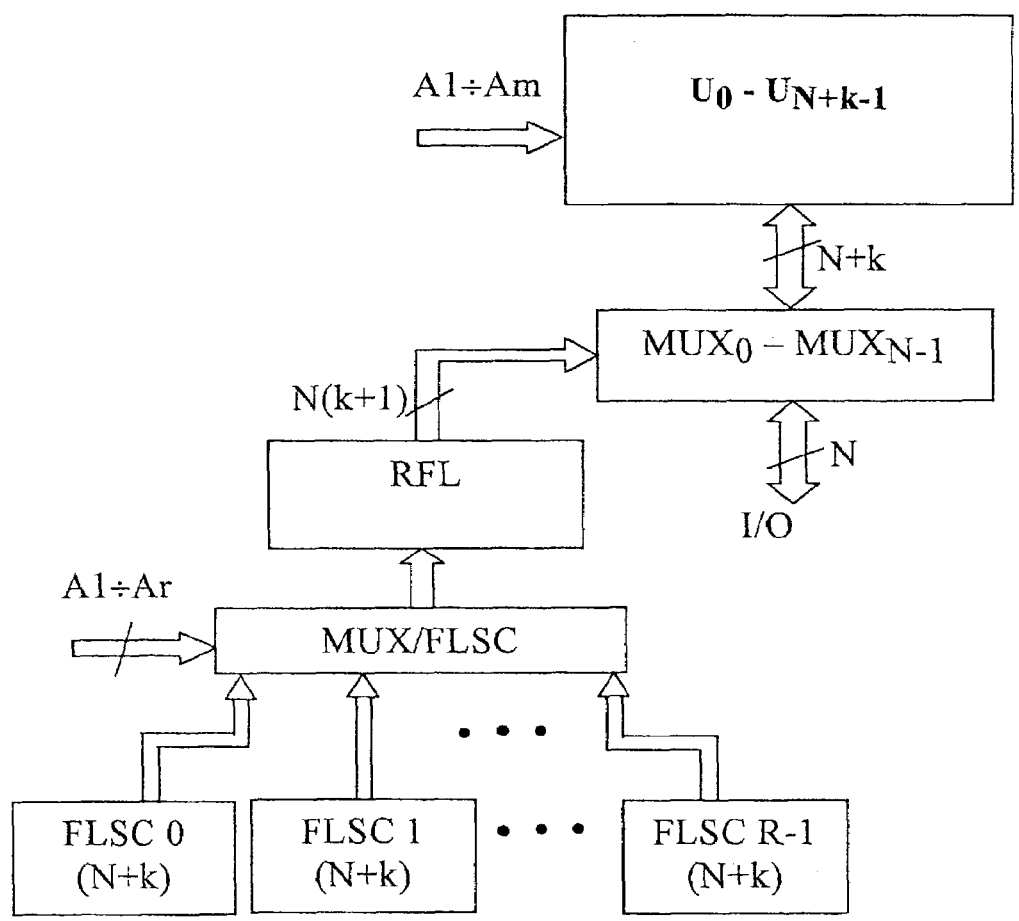
FIG. 3 shows an alternative of a first embodiment of the present invention.

FIG. 3 illustrates an embodiment of the present invention in a logic and simplified manner in the same type of representation as that done for prior art in FIG. 2.

The same base and replacement memory blocks $U_0$–$U_{N+k-1}$, the same multiplexers $MUX_0$–$MUX_{N-1}$, and a reconfiguration logic RFL can be found. The difference is that, if the memory is addressed by address bits A1 to Am, address bits A1 to Ar are separated, with r<m, A1 to Ar corresponding to r non-necessarily sequential address bits chosen from among the m address bits A1 to Am. $R=2^r$ address sets corresponding to the $2^r$ values of these r bits are thus formed. For each set of addresses i ($1 \leq i \leq R-1$), the state (right or erroneous) of the portions of the N base blocks and of the k redundant blocks, selected by this value, are stored in a set $FLSC_i$ of N+k fault location storage cells. N such sets ($FLSC_0$ to $FLSC_{R-1}$) will then be used. Then, when the memory is in operation, and is addressed by the current value of address bits A1–Am, a multiplexer (MUX/FLSC) which couples to reconfiguration logic RFL the set of cells corresponding to the considered address subset is addressed by bits A1–Ar of address bit set A1–Am. Logic RFL also generates, for each value of address bits A1–Ar, a specific configuration of the values on the control lines of multiplexers $MUX_0$–$MUX_{N-1}$. It should be noted that with this method, with only k replacement blocks, at best k*R faults can be corrected. In fact, account must be taken of the fact that the faults are not necessarily regularly distributed but, in any case, the number of redundant blocks associated with the base memory blocks can be strongly decreased.

Given that, as seen hereabove, the corrections depend on various address subsets, it will be here spoken of a dynamic repair system or of a dynamic reconfiguration of memory blocks or of associated redundant blocks, since a data terminal will not always be connected to the same base or replacement block, but it can change blocks according to the value of bits A1 to Ar. Thus, same replacement blocks will be used several times in various manners according to the address aimed at in the base memory blocks, whereby several faulty blocks can be repaired by using the same replacement block. The number of replacement blocks is thus reduced (or the number of possible repairs is increased).

As compared to the embodiment of FIG. 2, the embodiment of FIG. 3 increases the surface area taken up by the reconfiguration circuits since the number of fault location storage cells (FLSC) is multiplied and a multiplexer (MUX/FLSC) is added. However, those skilled in the art should note that, for large memories, this added surface area is small as compared to the surface area saved by the decrease in the number of replacement blocks.

Figure 4:
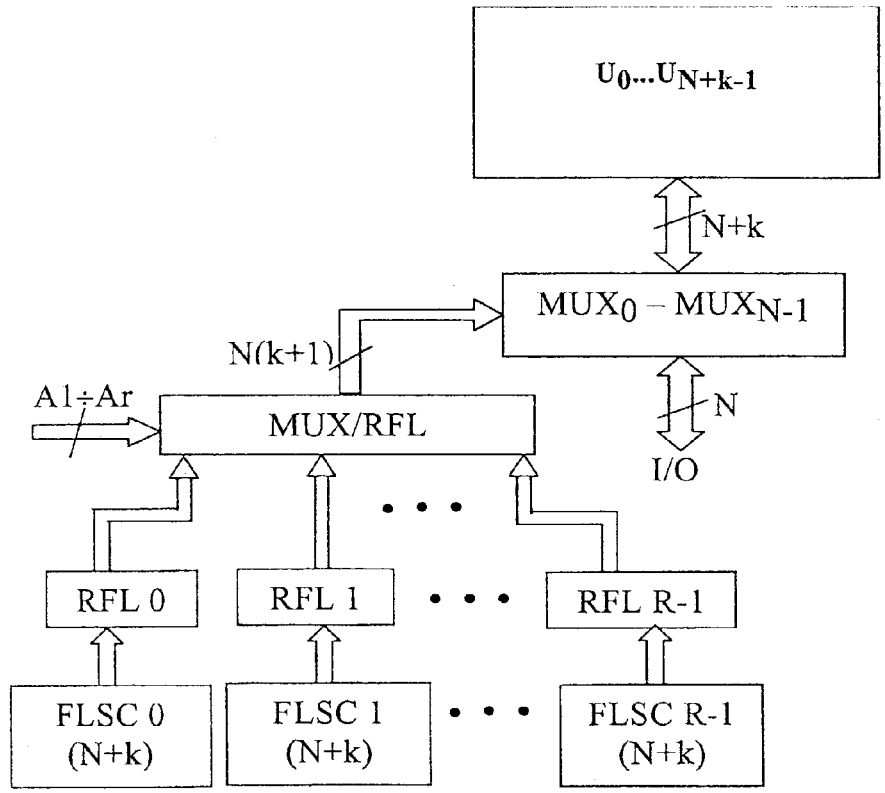
FIG. 4 shows an alternative of a first embodiment of the present invention.

FIG. 4 shows an alternative embodiment in which, instead of providing a global logic reconfiguration circuit RFL, a specific reconfiguration circuit $RFL_i$ ($RFL_0$ to $RFL_{R-1}$) is provided for each address subset. A multiplexer MUX/RFL selects one or the other of logic circuits $RFL_0$ to $RFL_{R-1}$, each of which is associated with one of R sets of N+k fault location storage cells $FLSC_0$ to $FLSC_{R-1}$.

Figure 5:
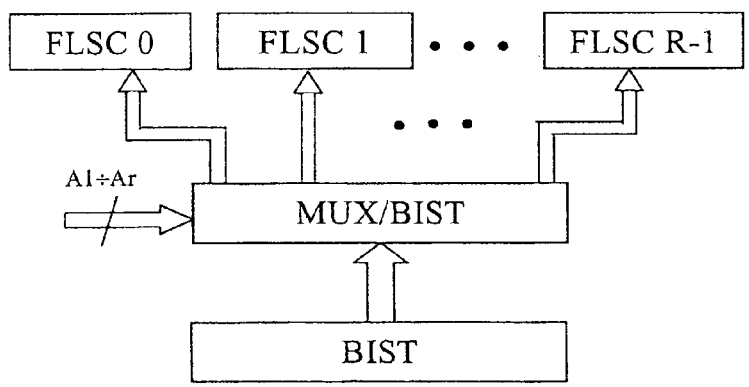
FIG. 5 shows a fault storage mode according to the present invention.

FIG. 5 illustrates a fault location information storage mechanism. The storage is performed for each address subset 0 to R−1. The defect indication may be provided in each case by an incorporated test circuit, currently designated as a BIST (Built-In Self-Test) circuit which, via a multiplexer MUX/BIST, sends the defect information to the adapted $FLSC_i$ cells according to an addressing by the proper address subset A1–Ar.

In FIGS. 1A, 1B, 2, 3, 4, and in FIGS. 7A, 7B, 9, 10 hereafter, the control signals of the multiplexers linked to the N input/output terminals are coded in a 1-among-k+1 code (that is, among the k+1 control signals of a multiplexer, a single signal takes value 1). On the other hand, the r control signals (A1–Ar) of multiplexers MIX/FLSC, MUX/RFL, and MUX/BIST in FIGS. 3, 4, 5, 8, 9 are coded in binary code. Of course, one or the other type of multiplexer may be used by adapting the control signals (a code of 1-among-n type can easily be turned into a binary code, and vice-versa).

In the foregoing, the distribution of the memory blocks which contain all the cells storing a single data bit has been considered. Blocks storing a subset of memory words may also be considered. The same static repair technique may be used to repair this type of blocks, as described in the above-mentioned PCT patent application.

A memory shared into $W=2^w$ blocks, such that each block comprises $2^m$ words, is considered. These blocks are selected by decoding w address bits. This decoding will provide $2^w$ selection signals (Select1, Select2, ... Select$2^w$) which are used to activated the access to one of these blocks. Thus, in each cycle, one of the signals is activated according to the value of the w address bits. The current operation (writing or reading) is then performed on the block determined by the active selection signal. The m remaining address bits are used to address a word within the selected block. The N data inputs/outputs of each block are connected to an N-bit data bus.

Figure 1A:
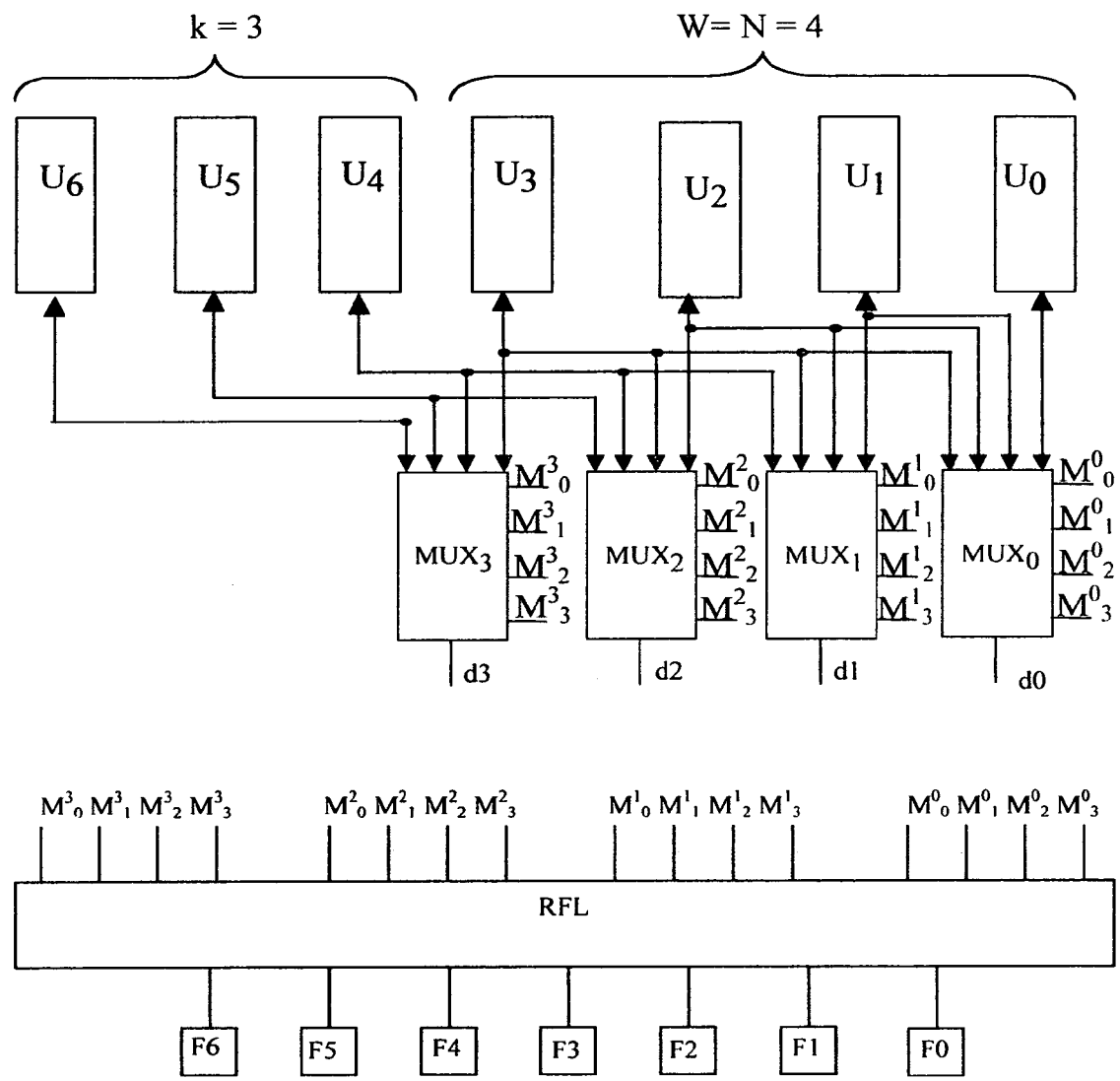
FIGS. 1A and 1B show examples of a static reconfiguration of memory blocks according to prior art.
Figure 1B:
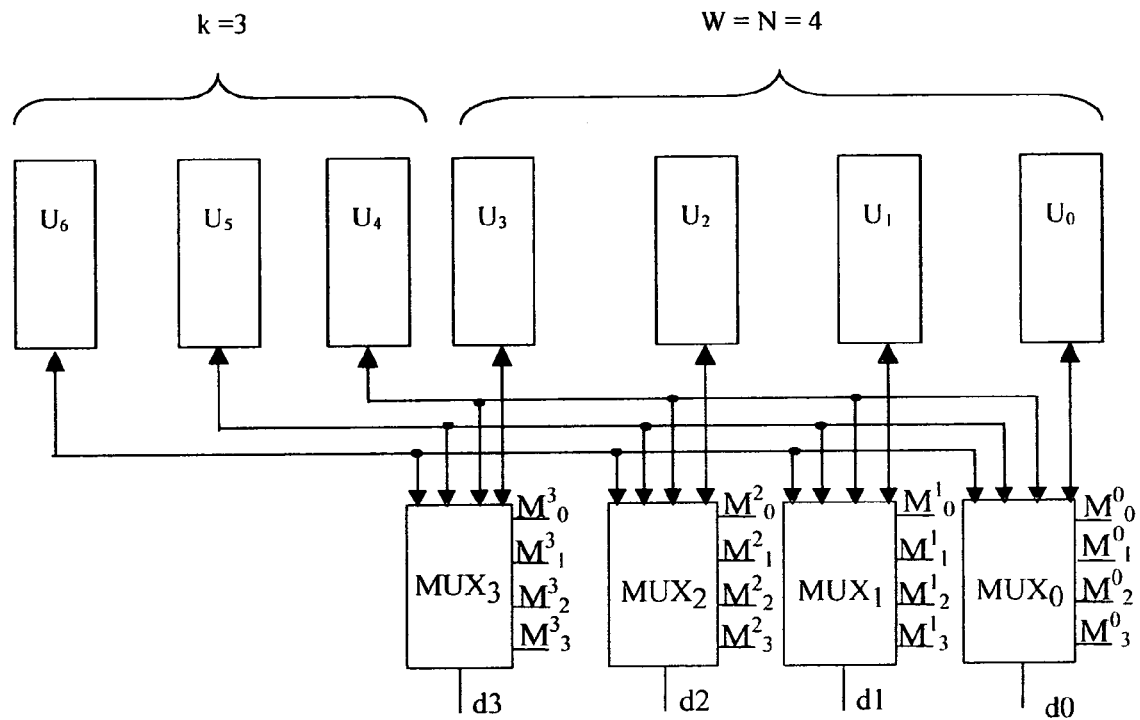
Figure 6:
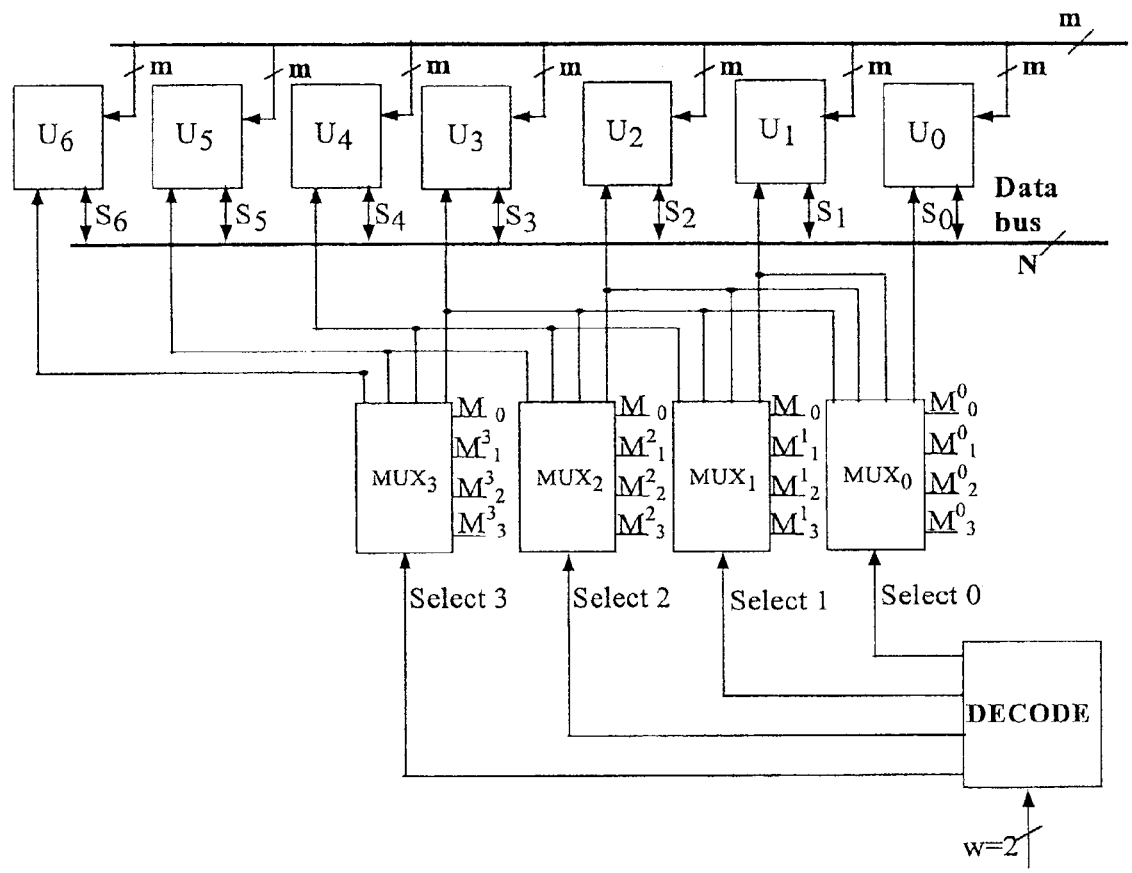
FIG. 6 shows an alternative of a first embodiment of the present invention.

FIG. 6 shows an implementation of the static repair for this architecture. The repair is performed by using $2^w$ multiplexers, which connect the $2^w$ selection signals Select1, Select2, ... Select$2^w$ to the selection signals of the $2^w=4$ base blocks (blocks $U_0$, $U_1$, $U_2$, and $U_3$) and of the k=3 replacement blocks (blocks $U_4$, $U_5$, and $U_6$). These multiplexers are controlled by control signals generated by a logic reconfiguration circuit (RFL). The circuits used for this repair (the multiplexers, the logic reconfiguration circuit and the fault location storage cells FLSC) are identical to the static repair case considering memory blocks comprising the cells which store a data bit (FIGS. 1A, 1B, and 2).

The circuits used for the dynamic repair of this architecture will also be identical to the circuits used in the case of a dynamic repair, considering memory blocks comprising the cells which store a data bit (FIGS. 3, 4, and 5). In fact, similarly to FIG. 5, r address bits are used to store in the test phase the fault location information in R=$2^r$ sets of FLSC cells. In operation, r address bits are used to select the set of FLSC cells which will be connected to the inputs of reconfiguration logic RFL, as in FIG. 3, or to select the block of the reconfiguration logic which will provide the control signals of the reconfiguration multiplexers (MUX$_0$, MUX$_1$, MUX$_2$, MUX$_3$) of FIG. 6, as in FIG. 4. The function of reconfiguration logic RFL is also unchanged.

Second Embodiment of the Present Invention Use of Single-Column Replacement Blocks In the first embodiment, calling Nd the number of cells connected to an input/output, $d_1$ to $d_N$, k redundant blocks formed of Nd cells each are used. It has been seen that, if the defects are regularly distributed, to repair v defects, k=v/R replacements blocks of Nd cells each could be used, but that in fact, this number had to be increased to take into account the irregular distribution of defects.

Figure 7A:
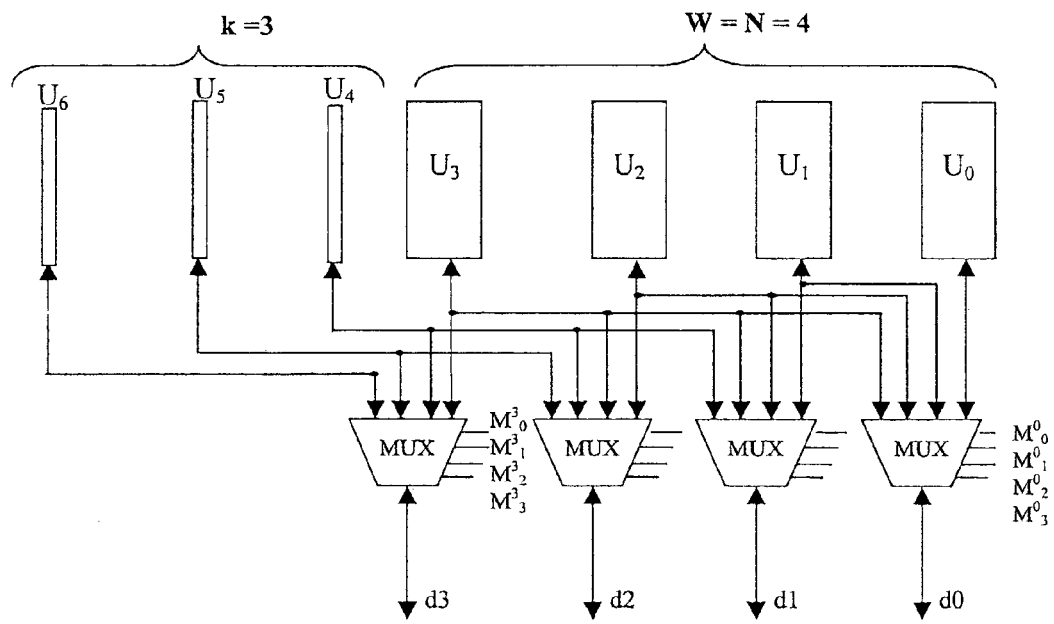
FIGS. 7A and 7B show an alternative of a second embodiment of the present invention.

This disadvantage can be avoided by the device illustrated in FIG. 7A. In this second embodiment of the present invention, instead of using replacement blocks which contain as many cells as there are blocks connected to an input/output (Nd cells), each of these blocks is made in the form of a reduced set of cells, for example, a single column. Thus, for a memory using a multiplexing of one column among 32, each replacement block will contain Nd/32 cells. A reconfiguration process can thus be used, in which the address bits used to control multiplexers MUX/FLSC or MUX/RFL of FIGS. 3 and 4 are the column address bits. R=32 and the dimension of the repairable unit is Nd/32 cells (1 column). The repair of any memory containing k defects is thus guaranteed, whatever the distribution of these defects in the memory.

Figure 8:
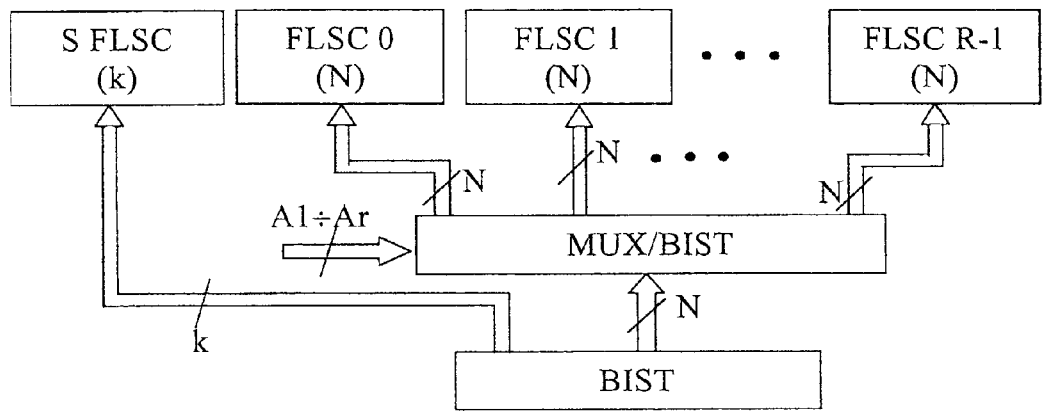
FIG. 8 shows an alternative of the fault storage mode.

Then, as illustrated in FIG. 8, rather than using R fault location storage sets FLSC$_0$ to FLSC$_{R-1}$ each containing N+k cells, R sets of flip-flops FLSC each containing N cells may be used to store the position of the faulty base block and one additional set (SFLSC) comprised of k flip-flops may be used to store the faulty positions among the k replacement columns. The programming of the various flip-flops is then performed as illustrated in FIG. 8 rather than as illustrated in FIG. 5. This is due to the fact that, since each of the replacement blocks comprises a single column, it is enough to assign a fault-signaling flip-flop to each replacement block.

Figure 9:
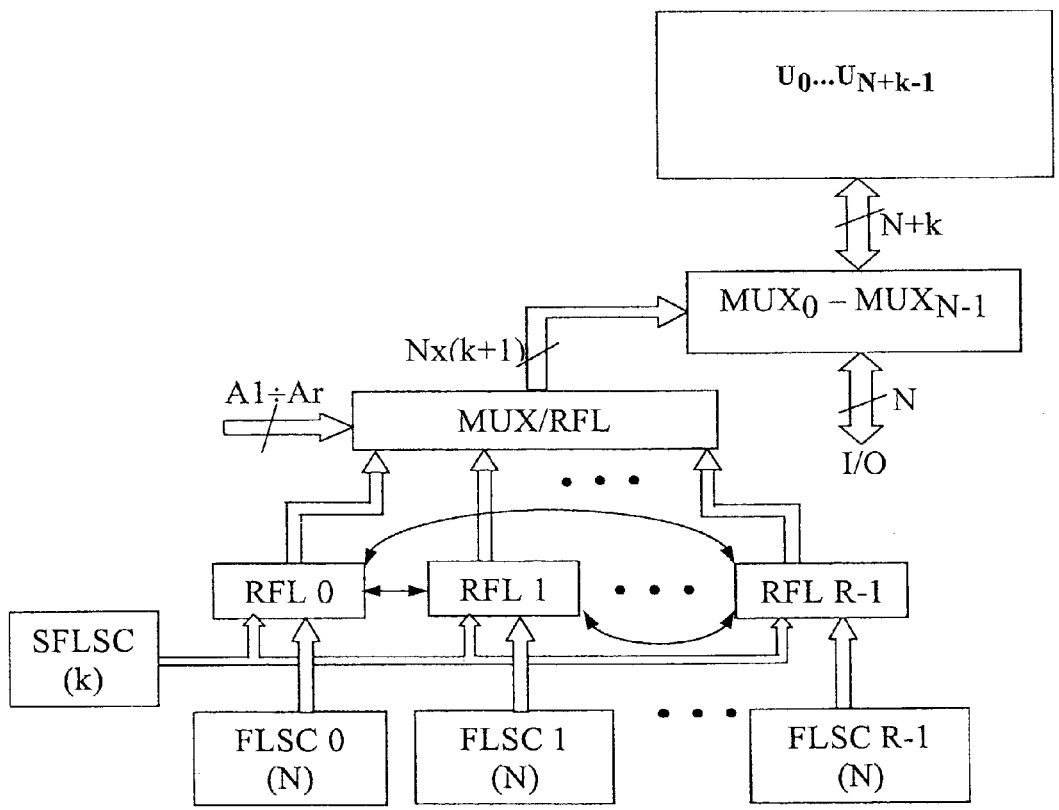
FIG. 9 shows an alternative of the second embodiment of the present invention.

FIG. 9 illustrates how the reconfiguration is carried out during circuit operation. The reconfiguration process is similar to that of FIG. 4. However, in FIG. 4, the blocks of the logic reconfiguration circuit (RFL blocks) have inputs which originate from different sets of FLSC flip-flops. However, in FIG. 9, the blocks of the logic reconfiguration circuit share certain inputs, that is, the outputs of the k SFLSC flip-flops. Also, in FIG. 4, the blocks of the logic reconfiguration circuit exchange no information (they perform independent functions). However, in FIG. 9, reconfiguration circuits RFL must perform interdependent functions and exchange information.

These interdependent functions will be described hereafter a) in the case of a close reconfiguration, b) in the case of a distant reconfiguration.

a) Close Reconfiguration

To simplify the analysis, intermediary variables will be introduced. Then, by means of these variables, it will be possible to use the reconfiguration functions obtained for the local static reconfiguration process described in PCT patent application FR0200523.

Let $F_i$ be the flip-flop state of replacement position i (N≦i≦N+k−1). Let $F_i^q$ be the state of the FLSC flip-flop for column q of regular position i (O≦i≦N−1). Let $M_j^{y,x}$ be the variable which indicates whether column x of position y must be shifted by j positions. In fact, variables $M_j^{y,x}$, 0≦j≦k, 0≦y≦N−1, are the outputs of logic reconfiguration circuits RFLx. To calculate these variables while taking into account the interdependence between the different logic reconfiguration circuits RFL, intermediary variables $F_i^{b,q}$ are introduced. Variable $F_i^{b,q}$ is used by reconfiguration logic circuit RFLq only.

For the positions i which have a complete set of columns (the regular positions), $F_i^{b,q}=F_i^q$, i∈{0, . . . N−1} (1), where $F_i^q$ is the value of the FLSC flip-flop of position i of group q.

For the positions having a single column (that is, the replacement positions), $F_i^{b,q}$ must be defined. This definition depends on the order which is used to assign replacement columns to replace other columns. The following assignment order may for example be considered: between any two columns of different positions, the first available replacement column is assigned to the column of lower position. Between any two columns of same positions; the first available replacement column is assigned to the column of smaller rank. With this convention, the values of variable $F_i^{b,q}$ can be determined as follows. Value 1 of variable $F_i^{b,q}$ indicates that replacement position i is not available to repair column q of position b, for one of the following reasons: position i is faulty or position i must be assigned to replace a column of position lower than b except for the columns of rank q, or to replace a column of position b and of rank smaller than q. In all other cases, the value of $F_i^{b,q}$ is equal to 0. With this definition of $F_i^{b,q}$, the occupation of position i by a column of rank q needs not be considered. This is due to the fact that the columns of same rank correspond to the same set of FLSC flip-flops. In FIG. 4, these flip-flops are processed by the same logic reconfiguration circuit RFL which takes into account the occupation of a replacement position by the other columns of same rank. They will thus be taken into account by the new equations obtained by replacing variables $F_i$ with variables $F_i^{b,q}$ in the equations of the RFL circuits of FIG. 4. The following equation is thus obtained for variables $F_i^{b,q}$ of replacement positions i, for i∈{N, 2, . . . N+k−1}, i−b≦k:

$$F_i^{b,q} = F_i + \sum_{\substack{x=1 \\ x \neq q}}^{R} \sum_{y=i-k}^{b-1} M_{i-y}^{y,x} + \sum_{x=1}^{q} M_{i-b}^{b,x} \qquad (2)$$

where Fi is the value of the SFLSC flip-flop of replacement position i. Symbol + represents the logic sum (or logic OR), and ΣX$_j$ represents the logic sum of terms X$_j$, for j∈{1, . . . n}.
There is no need to define $F_i^{b,q}$ for i−b>q since, for these values of i and b, variables $F_i^{b,q}$ will not be used in the equations of the RFL circuits (a position i cannot replace a position distant by more than k positions).

Of course, if another order is used to assign the replacement columns during configuration, another equation will be obtained for $F_i^{b,q}$. For example, if between two columns of different ranks, the first available replacement column is assigned to the column of lower rank, and if between two columns of same rank and of any position, the first available replacement column is assigned to the column of lower position, then variable $F_i^{b,q}$ will be equal to 1 if replacement position i is not available to repair column q of position b, for one of the following reasons: position i is faulty or position i is already occupied by a column of rank lower than q and of any position. The case of columns of same rank and of different positions has no influence upon $F_i^{b,q}$ since these columns are processed by the same RFL circuit. Thus, for replacement positions i and for i–b≦k, one obtains:

$$F_i^{b,q} = F_i + \sum_{x=1}^{q-1} \sum_{y=i-k}^{N-1} M_{i-y}^{y,x} \quad (2')$$

Then, to determine the logic function of a circuit RFLq, the equations described in above-mentioned PCT patent application, in which a single RFL circuit is used (case of a static reconfiguration) are used. These equations provide the function of outputs $M_y^x$ of the RFL block. Variables $M_y^x$ are then replaced in these equations by variables $M_y^{x,q}$. In the equation of each variable $M_y^x$, variables $F_x, F_{x+1}, \ldots F_{x+y}$ are also replaced with variables $F_x^{x,q}, F_{x+1}^{x,q}, \ldots F_{x+y}^{x,q}$.

The following equations are thus obtained:

$$M_0^{0,q} = {}^*F_0^{1,q} \quad (3)$$

$$M_1^{0,q} = F_0^{1,q} \cdot {}^*F_1^{1,q}$$

$$M_2^{0,q} = F_0^{1,q} \cdot F_1^{1,q} \cdot {}^*F_2^{1,q}$$

...

$$M_k^{0,q} = F_0^{1,q} \cdot F_1^{1,q} \ldots F_{k-2}^{1,q} \cdot {}^*F_{k-1}^{1,q}$$

...

$$M_j^{i+1,q} = {}^*F_{i+j+1}^{i+1,q}(M_j^{i,q} + M_{j-1}^{i,q} \cdot F_{i+j}^{i+1,q} + M_{j-2}^{i,q} \cdot F_{i+j-1}^{i+1,q} \cdot F_{i+j}^{i+1,q} + \ldots +$$
$$M_0^{i,q} \cdot F_{i+1}^{i+1,q} \cdot F_{i+2}^{i+1,q} \ldots F_{i+j}^{i+1,q})$$

where notation *F indicates the complement of F, symbols + indicate the logic OR and the points indicate the logic AND.

Variables $M_j^{i,q}$ for any i and j are the outputs of block RFLq of FIG. 4.

Equations (1), (2/2'), and (3) determine the reconfiguration functions for the process of FIG. 9. These equations may easily extend to the case where certain replacement blocks comprise a complete set of columns and/or certain replacement blocks contain a single column. In this case, equation (1) will apply to positions i corresponding to the base blocks as well as to replacement blocks comprising a complete set of columns, while equation (2/2') will apply to replacement blocks comprising a single column. Equations (3) remain unchanged.

Figure 7B:
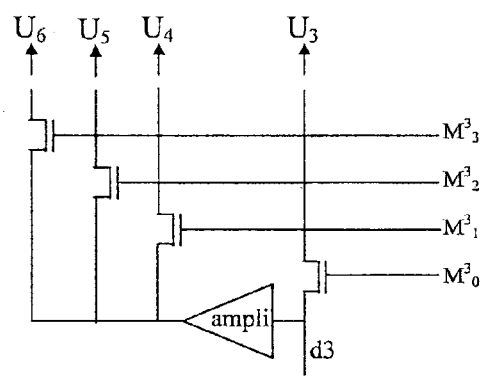

It should be noted that the columns of the replacement blocks use no column decoder, since these blocks comprise a single column. Thus, these columns are not isolated from the write amplifiers and access can be had thereto in each write cycle. To avoid destroying the content of a replacement column cell in each write cycle, one of the two following solutions is used:

for each replacement column SC, all signals $M_j^{y,x}$ enabling connection of column SC to any one of the data inputs/outputs are combined, to provide a signal which is active each time one of signals $M_j^{y,x}$ is active (for example, using an OR gate to combine these signals, if the active value is value 1); then, the resulting signal is used to activate the write amplifier only when column SC is connected to a data input; or for replacement columns, the write amplifiers are placed on the branches of the reconfiguration multiplexers connecting a data input to a replacement column, but on the data side, as shown in FIG. 7B for the case of the multiplexer of data terminal $d_3$. In this drawing, the write amplifier is placed on the branches connecting $d_3$ to replacement columns $U_4$, $U_5$, and $U_6$, and on the side of this terminal; thus, in a write operation, a replacement column will receive signals from a write amplifier only if it is connected to a data input.

the read amplifiers of the replacement columns can also be selectively activated similarly to the write amplifiers. This choice can be used to reduce the number of amplifiers activated in each reading to reduce the consumption. But this is a convenience choice and not a requirement as was the case for write amplifiers.

b) Distant Reconfiguration

Figure 10:
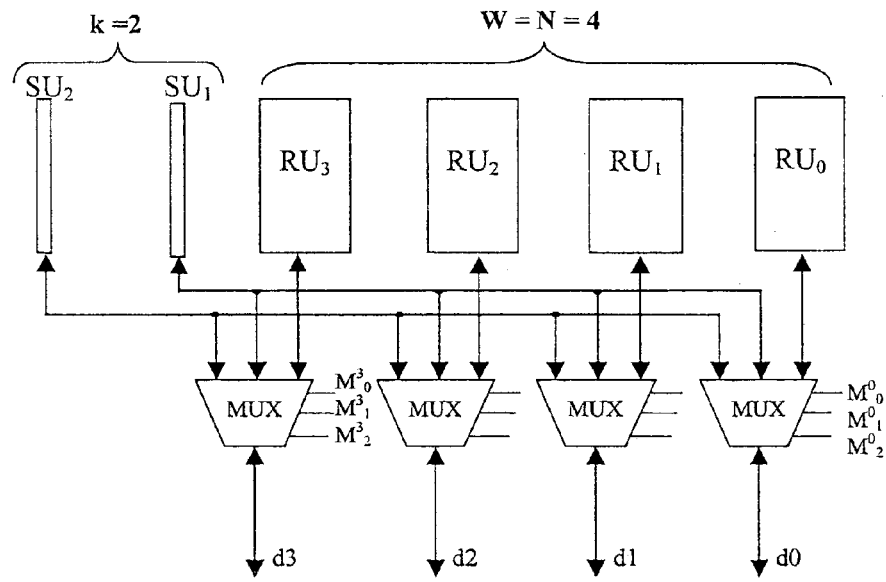
FIG. 10 shows an alternative of the second embodiment of the present invention.

The distant dynamic reconfiguration using single-column replacement elements is illustrated in FIG. 10. Each of base blocks $U_0, U_1, \ldots U_{N-1}$ contains R columns. Thus, the base blocks comprise a total N×R columns. Each of these columns may be replaced with any one of the replacement columns. Each replacement block comprises a single column.

In a fault-free operation, each value U of the column address bits A1–Ar selects one column in each of the base blocks. All these columns form the column group of rank U (or group U). Thus, there are R column groups: group 0, group 1, . . . group R–1. The reconfiguration functions will depend on the order according to which the replacement columns are assigned to the faulty regular columns. For example, replacement columns may first be assigned to the faulty columns of group 0. Then, unused replacement columns are assigned to the faulty columns of group 1, etc. Another possibility is to first assign the replacement columns to the faulty columns of block $RU_0$, after which unused replacement columns are assigned to the faulty columns of block $RU_1$, etc.

The repair processes of FIGS. 8 and 9 apply to the close repair as well as to the distant repair. The difference between these two cases is the implementation of the RFL functions. FIG. 10 shows the case of the distant repair using N=4 base blocks, $RU_0$, $RU_1$, $RU_2$, and $RU_3$, comprising several columns, as well as k=2 replacement blocks $SU_1$ and $SU_2$, comprising a single column. As in the case of a close repair, the interactions illustrated in FIG. 9, which enable using equations obtained from the repair process using replacement blocks comprising a complete set of columns, will be determined.

Figure 11:
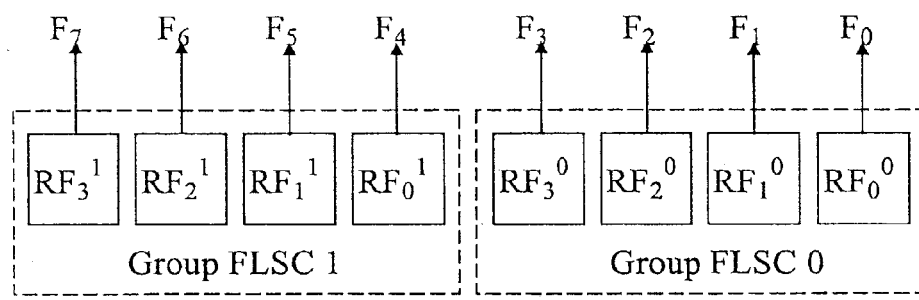
FIGS. 11 and 12 illustrate error storage embodiments according to the present invention.

A simple way of determining the reconfiguration functions consists of considering the R×N flip-flops of the regular positions of FIG. 8 as a single set. This set is arranged according to the order in which the replacement columns are desired to be assigned to the faulty regular columns. FIG. 11 shows the order corresponding to the case where replacement columns are first assigned to the faulty columns of set 0; unused replacement columns are then assigned to the faulty columns of set 1, etc. In this drawing, the case of four base blocks $RU_0$, $RU_1$, $RU_2$, and $RU_3$ each containing two columns, has been considered. There are then two column groups for the base blocks. Thus, there are two sets of FLSC flip-flops comprising four flip-flops each for these blocks. The outputs of the two sets of FLSC cells are called $RF_0^0$, $RF_1^0$, $RF_2^0$, $RF_3^0$ and $RF_0^1$, $RF_1^1$, $RF_2^1$, $RF_3^1$. Variables $RF_j^i$ have been replaced with variables $F_j$ such as illustrated in FIG. 11. The order of the new variables corresponds to the order of their indexes.

Figure 12:
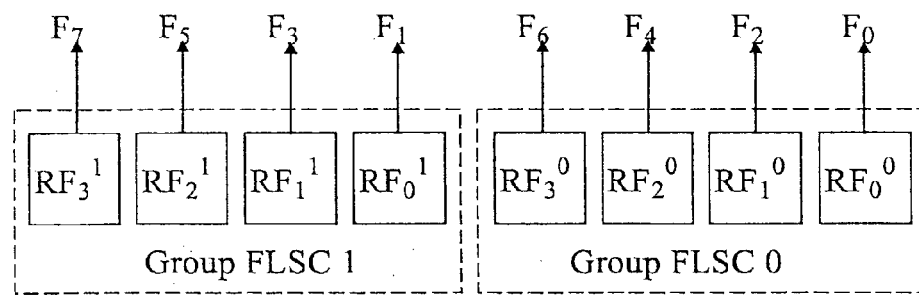

FIG. 12 shows the arrangement corresponding to the case where replacement columns are first assigned to the faulty columns of block $RU_0$, after which unused replacement columns are assigned to the faulty columns of block $U_1$, etc.

Once the reordering of the new variables has been performed, the new variables $F_j$ can be considered as the variables of a single set used in the static distant repair process. There are N×R signals $F_j$. There also are k signals SFq which are provided by the outputs of the SFLSC cells (FIGS. 8 and 9) corresponding to the replacement columns. Then, a single reconfiguration logic block RFL is used for the distant static repair. This block will receive as an input the N×R signals $F_j$ and the k signals $SF_q$. It will be formed by a distant reconfiguration function as described in the above-mentioned PCT patent application. This block will provide N×R sets of k+1 signals each, corresponding to the control signals of the R×N multiplexers of 1-among-k+1 type. These sets of signals will be reduced to N sets of k+1 signals. This is performed by a set of multiplexers controlled by address bits A1, A2, . . . Ar.

Figure 13:
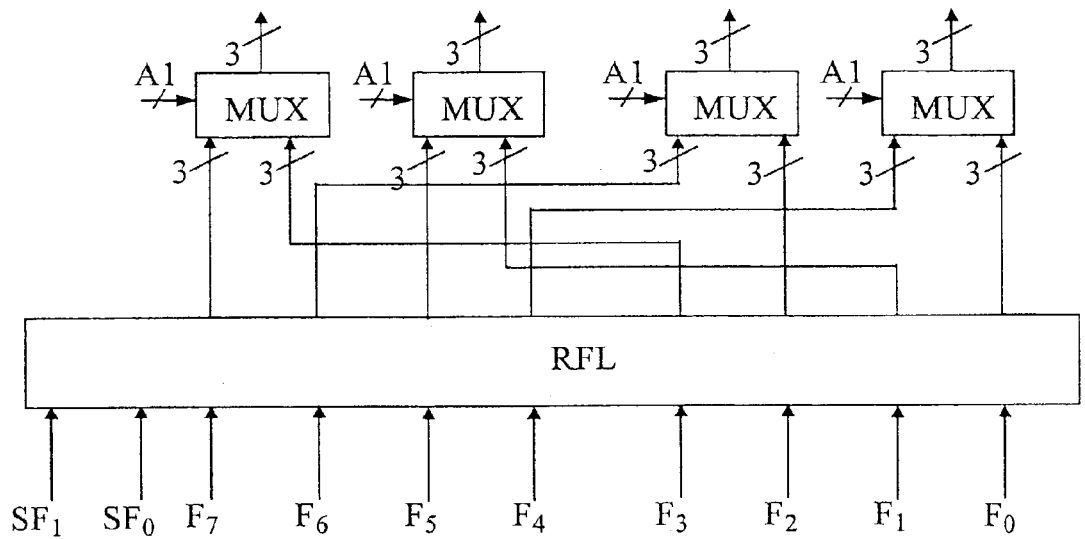
FIGS. 13 and 14 shows reconfiguration control circuits.
Figure 14:
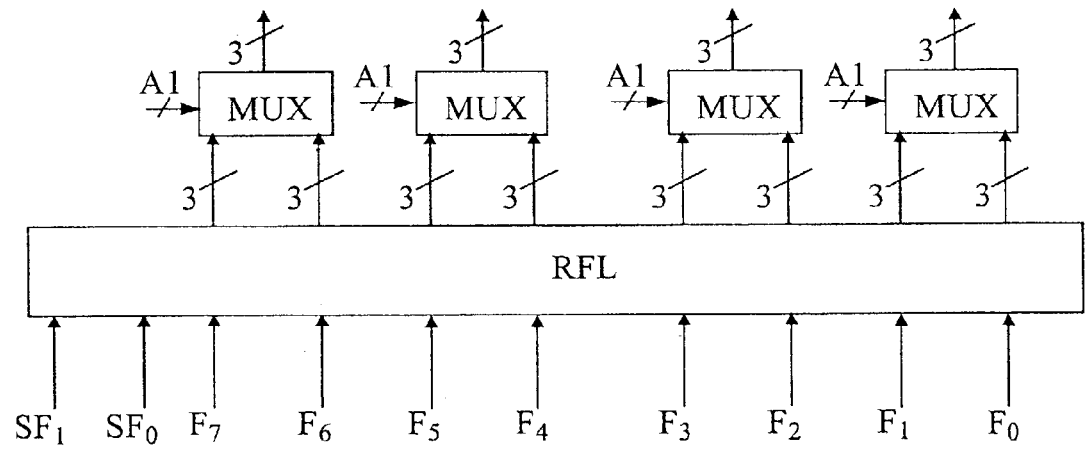

FIG. 13 shows this reduction for the example of FIG. 11. FIG. 14 shows this reduction for the example of FIG. 12. FIG. 14 is simpler since, in FIG. 12, a signal F of successive indexes corresponds to the columns of same positions ($F_0$ and $F_1$ correspond to the first and to the second column of position 1, $F_2$ and $F_3$ correspond to the first and to the second column of position 2, etc.). Thus, the first and second sets of output signals $M_j^i$ of the logic reconfiguration circuit of FIG. 12 are combined by the first multiplexer of FIG. 14, to provide multiplexer control signals of the first memory position. In FIG. 11, signals $F_0$ and $F_4$ correspond to the columns of the first memory position, signal $F_1$ and $F_5$ correspond to the columns of the second memory position, signals $F_2$ and $F_6$ correspond to the columns of the third memory position and signals $F_3$ and $F_7$ correspond to the columns of the fourth memory position. From this more complex arrangement, the more complex connections of FIG. 13 are obtained.

Delay Reduction

The repair of a memory causes an increase in delays. In the case of the static repair, this increase is minimum, since the signals generated by the reconfiguration logic are calculated in the repair phase, and remain stable during operation of the memory. Then, the generation of these signals adds no additional delay during this phase (see FIGS. 1A, 1B, and 2). However, in FIG. 3, the calculation delay of the control signals of multiplexers $MUX_0$–$MUX_{N-1}$ must be added. This delay is reduced in FIG. 4, in which the added delay only consists in the delay of multiplexer MUX/RFL, the outputs of the different blocks of the reconfiguration logic ($RFL_0$, $RFL_1$, . . . $RFL_{R-1}$) being calculated during the repair phase. Similar delays will be found in the case of FIGS. 8 and 9.

The delay added by the dynamic repair in FIGS. 3, 4, 5, 7A, 8, 9, and 10 has no significant effect during the read cycle. Indeed, in a reading, the content of the word to be read can be transferred to the bit lines and amplified by the sense amplifiers without waiting for the multiplexer control signals to be ready. Thus, the values of these signals can be calculated in parallel with these operations. However, in the write cycle, the dynamic reconfiguration adds an additional delay. To eliminate this delay, the generation of the controls of multiplexers $MUX_0$–$MUX_{N-1}$ shown in FIG. 9 will be modified according to FIG. 15. This technique will preferably be applied in the case of the distant repair of FIG. 10. Two types of controls can be made out in FIG. 9. Controls of the first type determine whether a data terminal $d_i$ is connected to base block $RU_i$. Controls of the second type determine whether a data terminal $d_i$ is connected to a replacement block $SU_j$. For controls of the first type, the write control signal (for example, signal "write enable") will be used to connect, during a writing, terminal $d_i$ directly to the output of block $RU_i$ by short-circuiting the multiplexer. This connection will result in writing into the faulty portions of block $RU_i$. However, this action will cause no operation error if care is taken to also write into the replacement portions which replace the faulty portions, and to connect to terminal di in a reading only these replacement portions.

Figure 15:
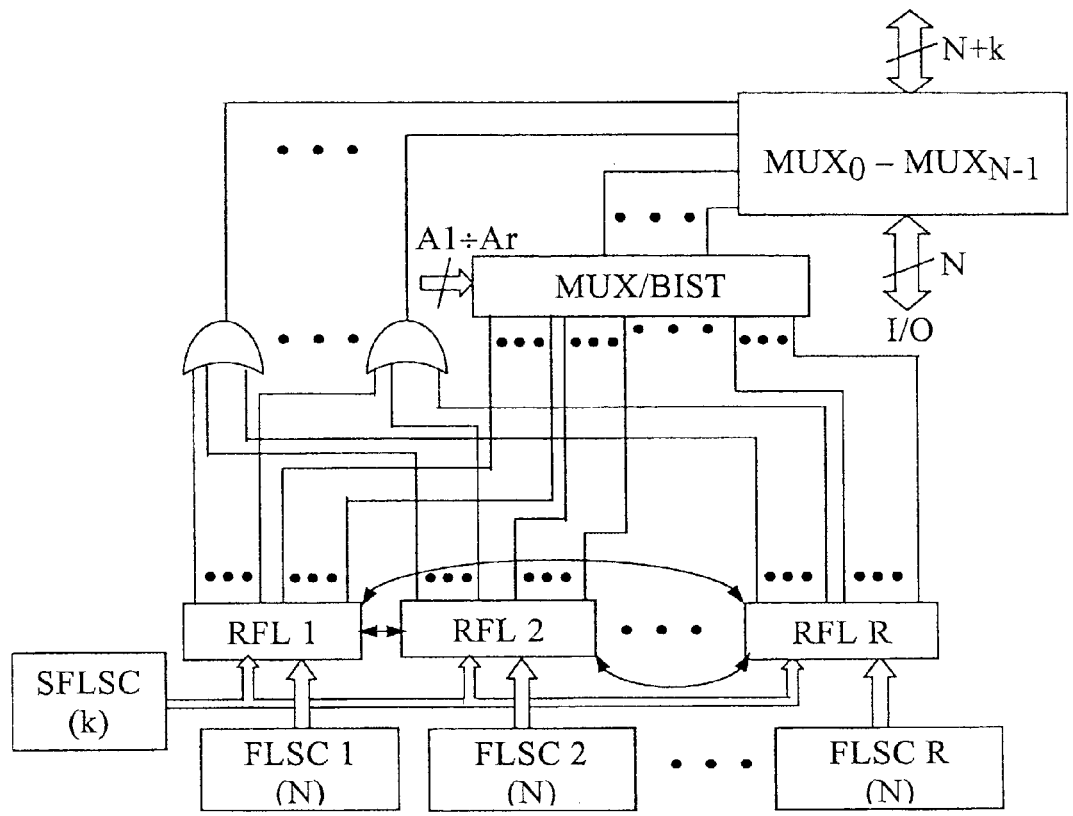
FIGS. 15, 16, and 17 illustrate an alternative of the second embodiment of the invention avoiding an increase in delays.
Figure 16:
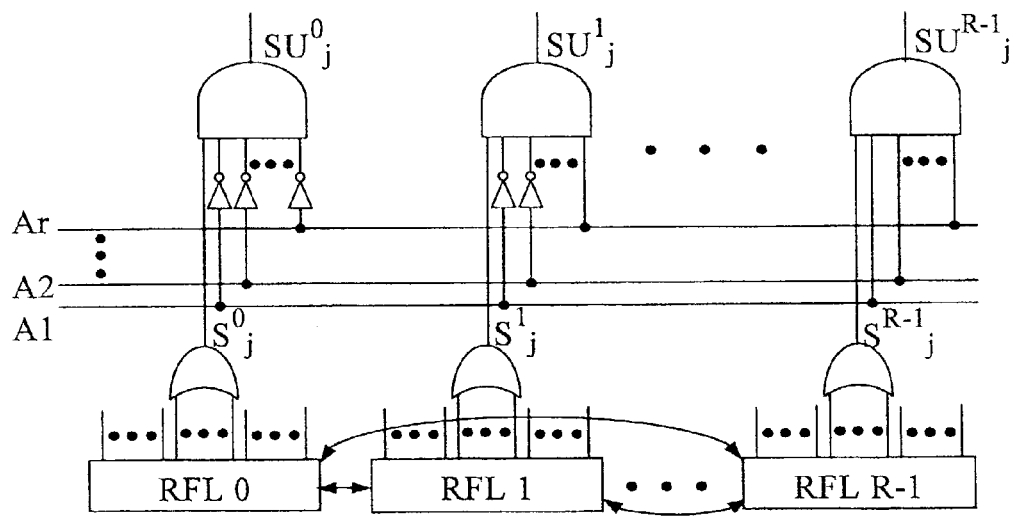
Figure 17:
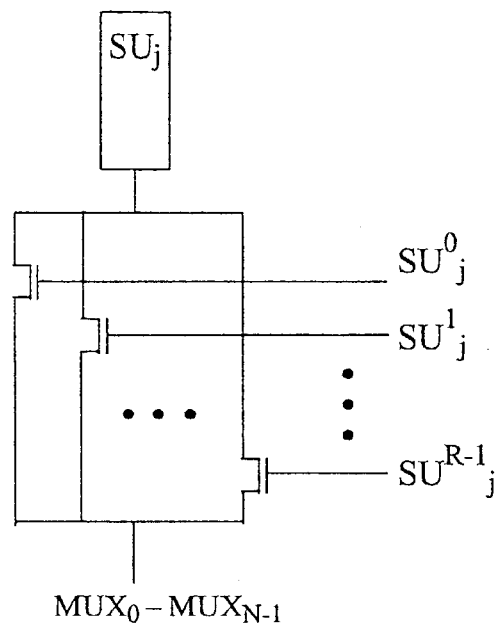

The generation of the controls of the second type is performed as follows. Consider the control signal of multiplexer $MUX_i$ which determines whether terminal $d_i$ must be connected to replacement block $SU_j$ at a given time. In FIG. 9, each of blocks $RFL_0$ to $RFL_{R-1}$ generates a signal for controlling this connection. There thus are R signals which are reduced to a single signal by multiplexer MUX/BIST controlled by address bits A1 to Ar. In FIG. 15, these signals are reduced to a single signal by using an OR gate. Thus, the control of the multiplexers of the second type are calculated in the repair phase, and introduce no delay in the operating phase. However, in this case, replacement block $SU_j$ will be connected to the data terminal $d_i$ not only at the time when bits A1 to Ar have a specific value, but permanently. To avoid this situation, the circuit of FIG. 16 will be used. For each block $RFL_q$ of the reconfiguration logic, this circuit uses an OR gate to reduce to a single signal all the signals generated by this block and intended for the control of the connection of replacement block $SU_j$ to any data bit. Signal $SU_j^q$ is thus obtained. This signal controls in turn a circuit which decodes binary value q on address bits A1 to Ar (an AND gate and a few inverters in FIG. 16) and generates on its output signal $SU_j^q$. Signal $SU_j^q$ controls a multiplexer illustrated in FIG. 17, which connects replacement block $SU_j$ to multiplexers $MUX_0$–$MUX_{N-1}$.

These circuits do not substantially affect the memory delay. In fact, signals $S_j^0$ to $S_j^{R-1}$ are calculated in the repair phase. Thus, their calculation adds no delay during the operating phase. For the rest, the decoder of bits A1 to Ar of FIG. 16 and the multiplexer of FIG. 17 will have a delay similar to those of the column decoder and of the base block column multiplexer, which anyhow exist in the memory. It should be noted that the multiplexer of FIG. 17 may be simplified if an OR gate having as an input signals $SU_j^0$ to $SU_j^{R-1}$ is used. The output of this gate will control a single-control multiplexer which will connect replacement block $SU_j$ to multiplexers $MUX_0$–$MUX_{N-1}$.

The same repair process can be used in the case where block $SU_j$ is formed of several columns. In this case, $SU_j$ will comprise a column decoder controlled by address bits Ar+1 to As, and a column multiplexer controlled by the outputs of this decoder. The base blocks will comprise a column decoder controlled by bits A1 to As (with s=r+t) and a column multiplexer controlled by the outputs of this decoder. The multiplexer of FIG. 16 will be controlled by bits A1 to Ar. In this case, the multiplexer of FIG. 17 will be connected in series with the multiplexer of block $SU_j$, and will add an additional delay. This delay can be reduced by combining the circuit of FIG. 16 with the column decoder of block $SU_j$. 2t signals will be obtained for each signal $SU_j^q$ and each value of bits Ar+1 to As. There will be a total $2^{t+r}$ signals which will control the column multiplexer of replacement block $SU_j$. There will thus be a delay similar to the base blocks.

Generalization of the Second Embodiment Replacement Blocks Formed of a Column Subset A dynamic reconfiguration which decodes a number of address bits (to select the FLSC flip-flops of the regular positions) greater than the number of address bits used to select the FLSC flip-flops of the replacement positions will be considered. Such a process is advantageous since the best compromise between the size of the repairable unit and the cost of the circuits used for the reconfiguration may require use of replacement blocks which comprise more than one column. For example, in a memory in which a column multiplexing of 1 among 16 (that is, using base blocks of 16 columns per data input/output) is provided, replacement blocks with 8 columns may be used. The column decoder for base blocks will use four address bits, while the column decoder for the replacement bits will use a subset of these address bits (3 bits in this example). The address bits used by the base block column decoder are designated as A1, A2, . . . Ar and the address bits used by the column decoder of the replacement blocks are designated as A1, A2, . . . Ap (p<r). In this case, a given value of bits A1, A2, . . . Ap will select the same column in the replacement blocks for all values of address bits Ap+1, Ap+2 . . . Ar.

For the k replacement blocks, P sets of FLSC flip-flops will be used ($P=2^p$). Each of these sets is formed of k FLSC flip-flops (one per replacement block). Each of these sets is selected by a value of the address bits A1, A2, . . . Ap. For the N base blocks, R sets of FLSC flip-flops will be used ($R=2^r$). Each of these sets is formed of N FLSC flip-flops (one per base block). Each of these sets is selected by a value of address bits A1, A2, . . . Ap, Ap+1 . . . Ar. It can be observed that a given value of bits A1, A2 . . . Ap selects a set of k FLSC replacement flip-flops, and $U=2^{r-p}$ sets of N base FLSC flip-flops. It should be noted that these flip-flops form a set of FLSC flip-flops such as that used in the (distant or close) dynamic reconfiguration process using k single-column replacement bits, and N base blocks with U columns. Thus, the circuit developed for this process will be used to generate a set of signals $M_i^j$ (see FIGS. 8 and 9). The r–p address bits will be used in this case to control multiplexer MUX/BIST of these drawings. In fact, this circuit will provide the control signals $M_i^j$ of the N multiplexers of 1-among-k+1 type. However, this circuit corresponds to a value of address signals A1, A2 . . . Ap. Thus, there will be P such circuits (one for each value of bits A1, A2 . . . Ap) and P sets of signals $M_i^j$ will be obtained. These circuits will be processed as being the P blocks of the logic reconfiguration circuits (RFL) used in the dynamic reconfiguration processes of FIGS. 3 and 4. As in these drawings, a set of multiplexers controlled by address bits A1, A2 . . . Ap will be used to reduce to a single set the P sets of signals $M_i^j$ generated by these P blocks. This set of signals $M_i^j$ will control the multiplexers placed on the memory inputs/outputs to perform a reconfiguration.

One may also, in a configuration of N base blocks with $S=2^s$ columns and k replacement blocks with $T=2^t$ columns, choose r=s−c and p=t−c, where c is a positive integer smaller than or equal to t, and perform the previously described reconfiguration by thus using a value $R=2^r$ smaller than the number of columns of the base block, and a value $P=2^p$ smaller than the number of columns of the replacement blocks. To repair a fault, a portion of the memory comprising 2c columns instead of one column is then replaced. However, these portions remain smaller than the base blocks which comprise 2s columns.

One may finally, in a configuration with N base blocks with $S=2^s$ columns and k replacement blocks with $T=2^t$ columns, choose r=s+c and p=t+c (c being a positive integer such that s+c is smaller than or equal to number m of the memory address bits), and perform the previously-described reconfiguration by thus using a value $R=2^r$ greater than the number of columns of the base block, and a value $P=2^p$ greater than the number of columns of the replacement blocks. To repair a fault, a portion of the memory comprising a subset of the cells of a column, more specifically, $\frac{1}{2}^c$ cells of a column, is then replaced.

These different cases result in a generalization of the second embodiment of the present invention, which can use all the values of r, R, p and P such that $R=2^r$, $P=2^p$, r=s+c, p=t+c, where c is an integer such that $-t \leq c \leq m-s$.

It should be noted that a technique similar to that previously described may be used for the read/write amplifiers.

It should further be noted that the second embodiment of the present invention also applies in the repair case where the replacement blocks and the base blocks comprise a set of memory words (such as the blocks used in FIG. 6), instead of a set of cells storing the value of a data bit. In this case, replacement bits comprising a set of words address by a number of address bits smaller than in the case of the base blocks may be used, according to the various previously-described configurations.

Figure 18:
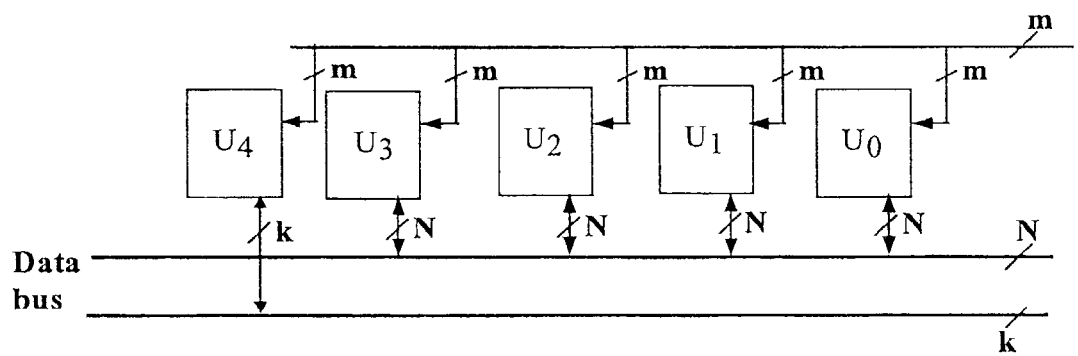
FIG. 18 shows an alternative of the embodiment of a memory comprising a redundant unit.

Another case of use of the second embodiment relates to the case where each base block comprises M N-bit words, as in FIG. 6, and each redundant block comprises M k-bit words. This is illustrated in FIG. 18, in which a single redundant block is used. The outputs of the base blocks are connected to an N-bit bus, as in the case of a RAM with no repair means. The outputs of the redundant block are connected to a k-bit bus. There thus is an N+k-bit data bus, with N base bits and k redundant bits. The N base bits of this bus can thus be seen as the inputs/outputs of N base units, and the k redundant bits of this bus can be seen as the inputs/outputs of k redundant units. This situation is similar to that of FIGS. 7A and 10, where the redundant units comprise less cells than the base units. In fact, in FIG. 18, the cells connected to each of the k redundant bits originate from a single block of M k-bit words, while the cells connected to each of the N base bits originate from several blocks of M N-bit words. Thus, these last cells are more numerous. The techniques of FIGS. 8, 9, 11, 12, 13, and 14 will then be used to perform the repair, replacing in the control of multiplexers MUX/BIST and MUX/RFL the r column address bits A1–Ar with the address bits of selection of the blocks with N-bit words (blocks $U_0$, $U_1$, $U_2$, and $U_3$ in FIG. 18). Given that a single block with k-bit words is used to repair several blocks with N-bit words, the address bits selecting the blocks with N-bit words cannot be used to isolate from the bus the outputs of the block with k-bit words which, in a cycle, are not used to replace outputs of a unit with N-bit words. To solve this problem, one of the techniques previously described in this second embodiment will be used (see for example FIG. 7B).

Several redundant blocks with k-bits words may also be used and a subset of the address bits used to select the N-bit words may be used to select at any time one of these blocks. The number of control signals of multiplexers MUX/BIST and MUX/RFL and the number of fault location storage sets (FLSC) for the base units will be reduced at the same time. Of course, the other cases of generalization of the second embodiment, shown hereabove, apply here as well.

Redundant blocks with k-bit words, such that each bit comprises a subset of the columns used by the bits of the blocks with N-bit words, may further be used. In this case, the repair architectures described in the second embodiment will be used by using, to control multiplexers MUX/BIST and MUX/RFL, certain column address bits and certain address bit of selection of the blocks with N-bit words. For example, if a single redundant block with k-bit words is used, such that each of the k bits comprises a single column, then the architecture of FIGS. 8 and 9, in which there will be $2^{r+w}$ FLSC and RFL blocks, will be used, and the r address bits of the columns and the w block selection address bits will be used to control multiplexers MUX/RFL and MUX/BIST. The various generalizations of the second embodiment apply to the present case. Further, the internal structure of the portions which generate the base bits and the redundant bits may be disregarded, only considering the address bits used by the first and not used by the second. The same repair architecture will then be used (FIGS. 8 and 9), by using these address bits to control multiplexers MUX/RFL and MUX/BIST.

As mentioned hereabove, multiplexers MUX/FLSC, MUX/RFL, and MUX/BIST may be controlled by r binarily-coded address bits (as in FIGS. 3, 4, 5, 8, 9), but they may also be controlled by signals coded in a code of 1-among-n type obtained by decoding these r address bits. Another technique to control these multiplexers consists of generating signals coded in a code of 1-among-n type, using a CAM with R r-bit words. Each word of the CAM also comprises a flag bit. All bits (including the flag bit) of all words in the CAM are set to 0. Each word has a matching signal. The matching signals control multiplexer MUX/FLSC or MUX/RFL of FIGS. 3, 4, and 9, as well as MUX/BIST of FIGS. 5 and 8. Two mechanisms are used to activate a matching signal. First, in each cycle of the test phase and of the operating phase, the current value of the r address bits is compared with the content of the CAM words. If the comparison succeeds for a word having its flag bit at 1, the matching signal of the word is activated. Second, in the test phase, if a fault is detected during a cycle, and if no matching signal is activated by the first mechanism, the matching signal of a word of the CAM having its flag bit at 0 is activated. At the same time, the current value of the r address bits is written into this word and value 1 is written into its flag bit. Thereby, a value of the r address bits is loaded into a new word of the CAM, only if this value has not been loaded in another word of the CAM before, in another error detection. Thus, in the test phase, the activation of a matching signal by one or the other of the two mechanisms selects via the MUX/BIST a set FLSC of fault location cells to store the position of the faulty portions found in this cycle. In operation, the activation, by the first mechanism, of a matching signal selects, via the MUX/RFL or the MUX/FLSC, the signals originating from the FLSC set selected by the same matching signal in the test phase. An interest of this technique is the possibility of using a number of CAM words, of FLSC sets and of RFL sets smaller than $2^r$.

Third Embodiment of the Present Invention Use of Cams

In the first and second embodiments and their various alternatives, it has been assumed that the blocks containing defects were signaled by a storage in flip-flops and that, as soon as a unit containing a defect was addressed, various multiplexers would redirect the inputs/outputs of the corresponding unit to a replacement unit or subset. These multiplexers are connection/disconnection means for disconnecting from the rest of the system a faulty unit and connecting in its place a fault-free unit.

Figure 19:
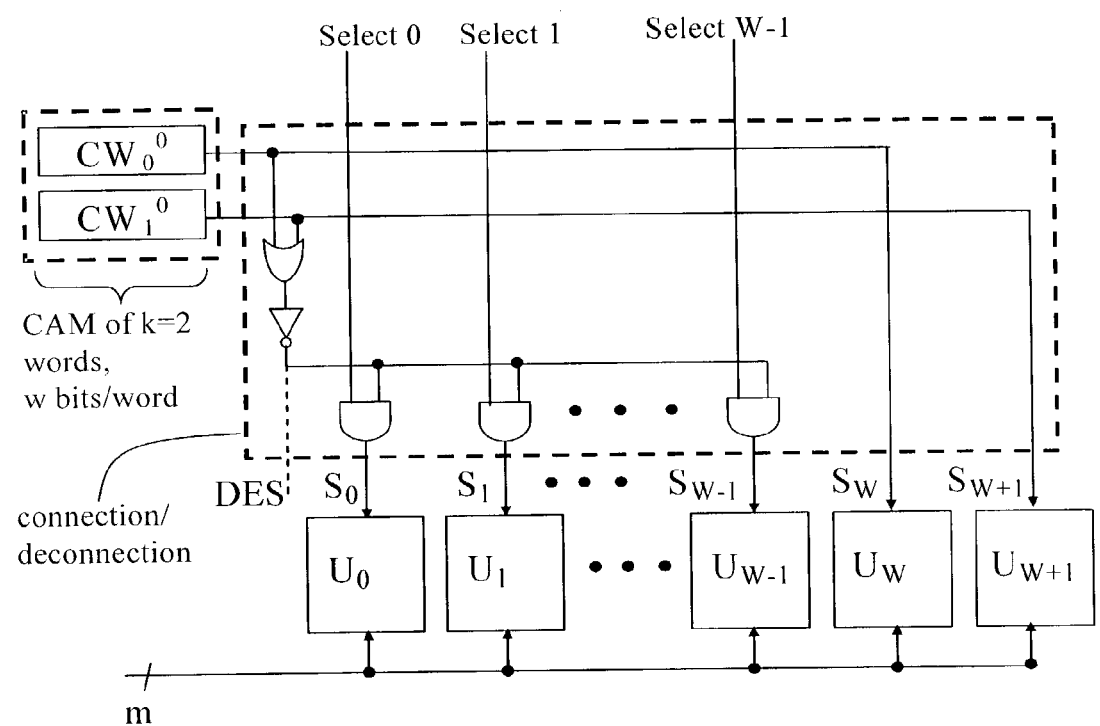
FIG. 19 shows another example of static reconfiguration of memory blocks.

According to a third embodiment of the present invention, shown in FIG. 19, the memory is formed of W base blocks and k replacement units are used. The words of each of these blocks are addressed by m address bits. Further, w address bits are decoded, as in FIG. 6, to generate W signals of selection of W base units. To carry out the repair, a CAM comprised of k w-bit words is also used. In the test phase, the detection of a fault in the memory activates the writing into a CAM word of the value of the w address bits. The selection of the CAM word in which this writing is performed may be carried out by a mechanism which skims through the CAM words, each time selecting a new word to perform a writing. For example, a counter which increments for each writing into the CAM may be used. The content of this counter is used to address the CAM word in which the next writing will be performed. In the operating phase, in a memory access, the w address bits are compared in parallel with each of the CAM words. If the comparison succeeds for a CAM word, a matching signal is activated. k matching signals are thus obtained (one signal per CAM word). These signals control the connection/disconnection means which generate W+k selection signals ($S_0, S_1, \ldots S_{W+k-1}$) to select for each memory access one from among the W+k redundant and base units. In the present case, the connection/disconnection means consist in a block which transfers the values of the k matching signals of the CAM onto signals $S_W$, $S_{W+1}, \ldots S_{W+k-1}$ of selection of the k redundant units, and deactivates selection signals $S_0, S_1, \ldots S_{W-1}$ of the base units if one of the matching signals is activated. Thus, the current operation (writing or reading) is performed on the unit selected by the active selection signal, and in the word of this unit addressed by the m address bits. This technique replaces, with the $2^m$ words of a replacement unit, the $2^m$ memory words selected by addresses having w bits equal to the w bits stored in a CAM word. The $2^m$ replaced words will be physically placed in a base block, but this is not necessary. In fact, the connection/disconnection block can be modified to generate instead of signals $S_0, S_1, \ldots S_{W-1}$ a single deselection signal (signal DES drawn in dotted lines in FIG. 19), which deactivates the memory containing the base portions. This memory can then be organized in any manner, and it is not necessary for the w address bits to be the bits of the base memory blocks. The only constraint is for these bits to be the address bits unused by the redundant units.

It should be noted that several faults in the memory, affecting words selected by the same value of the w address bits, will also be repaired by the same replacement block. Thus, a given value of the w address bits needs storing in a single CAM word. But faulty words, selected by the same value of the w address bits, may be detected several times during the testing. To avoid storing the same value of the w address bits in several CAM words, the value of the w address bits is compared upon each fault detection with the values of the words already stored in the CAM, and if the comparison succeeds, it is avoided to store again the same value of the w address bits.

A cell containing a fault indication flag may also be added to each CAM word. In a test phase of the CAM, value 0 will be written into this flag if the CAM word is free of defects and value 1 will be written therein if it is faulty (or conversely). Value 1 will disable the use of the faulty CAM word to perform the repair. However, since a single CAM word is used per replacement unit, one faulty CAM word can stop a repair, even if the repair unit is not faulty. To avoid this situation, one may include in the CAM more than one word per replacement unit. Thus, if a CAM word is faulty, one of the other CAM words associated with the same replacement unit can be used to select the replacement unit. Then, in the memory test phase, if the flag of the CAM word selected to perform a writing is at 1, another word is selected to carry out this writing. In normal operation, value 1 of this flag deactivates the matching signal of the word. The flag bit of a CAM word may also be set to one to indicate that the selected replacement unit selected by this word is faulty. This may for example be done in a test phase which checks the replacement units and, when a replacement unit appears to be faulty, the cell of the CAM word flag is set to one. If several CAM words per replacement unit are used, the flag cells of all these CAM words will be set to one when the corresponding replacement unit is faulty.

Figure 20:
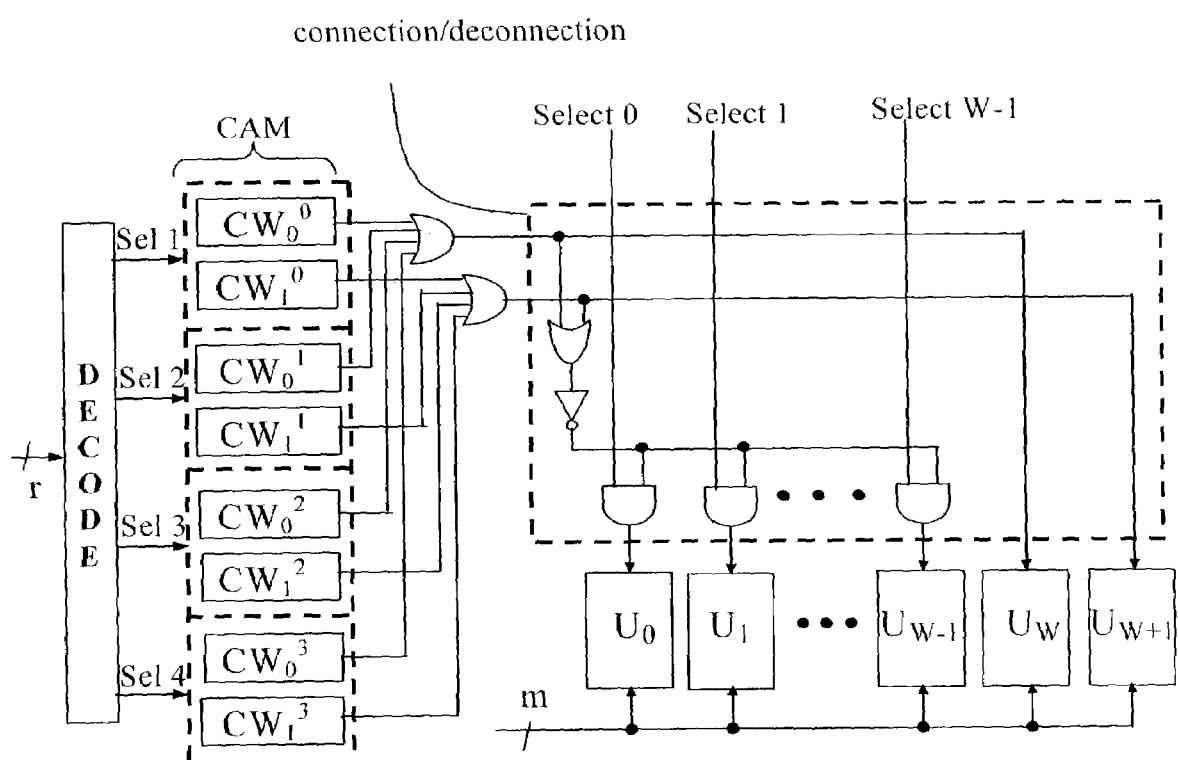
FIG. 20 shows an alternative of a third embodiment of the present invention using content-addressable memories (CAMs)

The static repair just described uses a unit of $2^m$ words to repair a fault. A dynamic repair could more efficiently use the replacement resources. The dynamic repair may be performed in a way similar to the dynamic repair discussed hereabove. In this case, r of the m address bits will be used to perform the dynamic repair. A CAM comprising $k \times 2^r$ w-bit words will also be used. These words will be gathered in $R=2^r$ groups of k words, as shown in FIG. 20. The r address bits are decoded to generate R signals Sel1, Sel2, . . . SelR which will select for each of the R values of these bits one of the R word groups of the CAM. Thus, each operation performed, during the test phase and in normal operation, in the CAM of FIG. 19, will now occur in the group of the CAM words of FIG. 20, selected by the current value of the r address bits. In the other groups, no write or comparison operation will be performed. The comparison may also be performed over all the CAM words, and the current value of the r address bits may be only used to enable the matching signals of the corresponding word group. For the rest, the operation performed in the selected word group develops as described in the case of the static repair shown in FIG. 19.

It should be noted in FIG. 20 that there are k×R matching signals (one signal per CAM word). These signals are reduced to k signals by using k logic gates with R inputs. The gate of rank i receives as an input the R matching signals of rank i of the R word groups of the CAM. The k outputs of these gates are used to control the connection/disconnection means, as in FIG. 20.

With this repair a set of $2^{m-r}$ memory words (the set addressed by a given value of the w+r address bits and of all the possible values of the other m−r address bits) is replaced with all the words of a replacement unit addressed by the same value of the r address bits and of all possible values of the m−r address bits.

Instead of the decoder of r address bits, a second CAM may be used to generate the signals of selection of the k-word CAM groups of FIG. 20. The operation of the second CAM is similar to the CAM operation described in the first two embodiments. The matching signals generated by the second CAM will be used to select the k-word CAM groups of FIG. 20.

Figure 21:
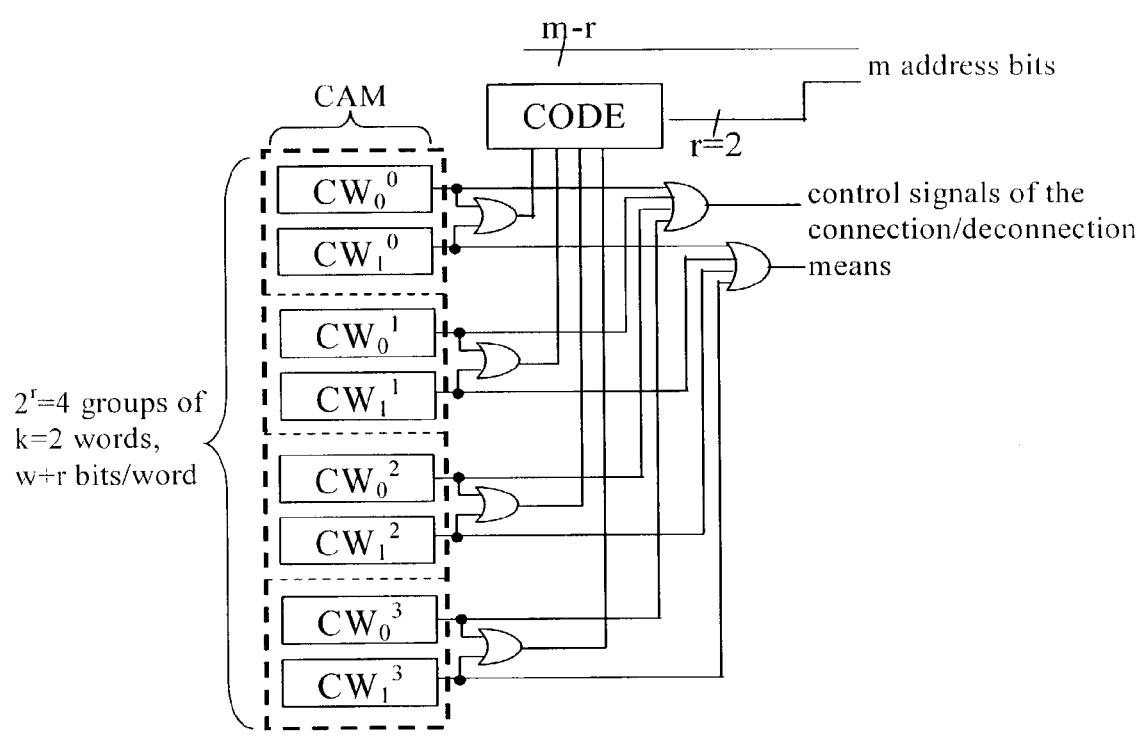
FIG. 21 shows an alternative of a third embodiment of the present invention.

In the embodiment shown in FIG. 21 the replacement can be performed with all the words in a replacement unit, addressed by a freely chosen value of the r address bits and of all the possible values of the m−r bits. A more efficient repair is thus obtained, since the implementation shown in FIG. 20 cannot repair a memory which contains defects in more than k sets of words described hereabove, for which the r address bits take the same value. To obtain this flexibility, FIG. 21 uses no decoder to select a group of R CAM words. Instead, it uses CAM words containing w+r address bits. Apart from the fact that larger CAM words are handled, the write and comparison operations of the k×R words of the CAM are carried out in the same manner as the operations performed in the k w-bit words of the CAM of the static implementation shown in FIG. 19. In particular, in the test phase, w+r address bits are stored in the CAM words. In normal operation, the w+r bits of the current address are compared with all the CAM words to activate a matching signal when the comparison succeeds for a word. The use of the flag bits is performed identically to the case of the static repair of FIG. 19. The k control signals of the connection/disconnection means are generated by using k R-input gates, identically to the dynamic repair of FIG. 20.

The words of each replacement unit are addressed by m bits, as in FIG. 20. But only m−r of these bits are the memory address bits. The r remaining bits are generated by means of R k-input logic gates. Each of these gates receives as an input the k matching bits of a group of the CAM words. R signals, only one of which can take value 1 for each operating cycle, are thus obtained, since a value of the w+r address bits can be stored in a single valid CAM word (word having its flag containing value 0). Thus, these signals may take R+1 values, value 000 . . . 0 and the R values of the 1-among-R code. The R values of this code are transformed by a coding block into r signals coded in binary code. These signals provide the replacement units with the r missing address bits.

Another advantage of the technique used in FIG. 21 is the use of replacement units smaller than the base units. Thus, replacement units containing $2^{m-c}$ words and using m−c address bits may be used. In this case, a CAM having $2^{r-c}$ groups of k w+r-bit words will be used. $2^{r-c}$ k-input gates will then be used. Each of these gates receives the k matching bits of a word group of the CAM. The $2^{r-c}$ outputs of these gates are coded into r−c signals. These signals are combined with the m−r address bits to form the m−c address bits of the replacement units. Of course, it is here considered that c<r.

Of course, the various embodiments of the present invention may be combined in various manners and various equivalent means may be retained.

The present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for repairing faults in a memory with W base units and k redundant units, each base unit comprising at most $S=2^s$ identical portions, selected by s address bits, z among said k redundant units ($z \geq 0$, k−z>0) each comprising the same number of portions, of same size, as the base units, selected by s address bits, the k−z other redundant units each comprising at most $T=2^t$ portions of same size as the base units, selected by t address bits which form a subset of the s address bits, and comprising:

storage means for storing the fault locations, connection/disconnection means for disconnecting from a rest of the memory faulty units and connecting in their place fault-free units, and means for generating control signals of the connection/ disconnection means, responding to the content of the storage means, the value of the control signals determining the units to disconnect and the units to be connected instead, wherein:

in a test phase, fault tests are carried out for the different units, and the results of the fault tests of each portion of the k–z redundant units are stored in at most $P=2^p$ distinct sets of storage means, selected by p address bits which form a subset or superset of the t address bits, with p=t+c, c being a negative, positive or zero integer, such that $p \geq 0$, and the results of the fault tests of each portion of the base units and of the z redundant units are stored in at most $R=2^r$ distinct sets of storage means, selected during the test phase by r address bits which form a superset or subset of the s address bits, with r=s+c, and in a use phase aiming at the use of given unit portions, said control signals are determined by the content of the storage means corresponding to these unit portions, said control signals being a function of the p address bits and of at most $P=2^p$ groups of intermediary control signals, each group of the intermediary control signals being a function of:

the content of all the storage means affecting the k–z redundant units, selected in the test phase by a value of the p address bits, at most $U=2^{r-p}$ sets or means for storing the locations of the faults affecting the base units and the z redundant units, selected during the test phase by the same value of the p address bits, and u from among the r address bits other than the p address bits (u=r–p).

2. The method of claim 1, applied to a memory with W base units and k redundant units, wherein each base unit comprises a set of memory cells connected, in the absence of faults, to the same data bit.

3. The method of claim 1, wherein: the $S=2^s$ portions of the base units and the $T=2^t$ portions of the redundant units are columns respectively selected by s and t address bits, p=0, P=1, the control signals, determining the connection of the base units to the data bits, are a function of the r address bits, of the content of all the means for storing locations of the faults in the redundant units, and of the content of the $U=R=2^r$ sets of means for storing fault locations in the base units, the connection of each base block to the corresponding data bit is established for each write operation, the control signals, determining the connection of the replacement bits to the data bits, are a function of the content of all the means for storing locations of the faults in the redundant units, and of the content of the $U=R=2^r$ sets of means for storing fault locations in the base units, and the connection of the replacement blocks to the data bits is provided by a multiplexer controlled by signals which are a function of the content of all the means for storing locations of the limits in the redundant units, and of the content of the $U=R=2^r$ sets of means for storing fault locations in the base units.

4. A method for repairing faults in a memory having W base units and k redundant units wherein the base units are selected by W selection signals and the redundant units are selected by k selection signals, the elements of each base unit being memory words selected by m address bits the elements of each redundant unit are memory words selected by m–c address bits, said memory comprising:

storage means for storing the fault locations, said storage means consisting of a content addressed memory (CAM) comprising several groups of k words of (w+r) bits, connection/disconnection means for from a rest of the memory faulty units and connecting in their place fault-free units, the connection/disconnection means receive k control signals and W signals generated by a circuit which decodes w address bits, and generate the W selection signals of the base units and the k selection signals of the redundant units, and means for generating control signals of the connection/ disconnection means, responding to a content of the storage means, values of the control signals determining the units to disconnect and the units to be connected instead, wherein:

each unit is divided into several portions, in a test phase, fault tests are carried out for the different units, and test results of different portions of the units are stored in the storage means, the current value of thee w+r address bits is stored in a word of said CAM upon each fault detection, and in a use phase aiming at use of given unit, said control signals are determined by the content of the storage means corresponding to these unit portions, the current value of the w+r address bits being compared with the content of all the words in the CAM to activate a matching signal for each word containing the value of the w+r address bits, the control signals being a function of the matching signals of the CAM, and the redundant units being addressed by m–r base address bits of the RAM and by r–c bits generated from the matching bits of the CAM.

5. An apparatus for repairing faults in a memory with W base units and k redundant units, each base unit comprising at most $S=2^s$ identical portions, selected by s address bits, z among said k redundant units ($z \geq 0$, k–z>0) each comprising the same number of portions, of same size, as the base units, selected by s address bits, the k–z other redundant units each comprising at most $T=2^t$ portions of same size as the base units, selected by t address bits which form a subset of the s address bits, and comprising:

storage means for storing the fault locations, connection/disconnection means for disconnecting from a rest of the memory faulty units and connecting in their place fault-free units, and means for generating control signals of the connection/ disconnection means, responding to the content of the storage means, the value of the control signals determining the units to disconnect and the units to be connected instead, wherein:

in a test phase, fault tests are carried out for the different units, and the results of the fault tests of each portion of the k–z redundant units are stored in at most $P=2^p$ distinct sets of storage means, selected by p address bits which form a subset or superset of the t address bits, with p=t=c, c being a negative, positive or zero integer, such that $p \geq 0$, and the results of the fault tests of each portion of the base units and of the z redundant units are stored in at most $R=2^r$ distinct sets of storage means, selected during the test phase by r address bits which form a superset or subset of the s address bits, with $r=s+c$, and in a use phase aiming at the use of given unit portions, said control signals are determined by the content of the storage means corresponding to these unit portions, said control signals being a function of the p address bits and of at most $P=2^p$ groups of intermediary control signals, each group of the intermediary control signals being a function of:

the content of all the storage means affecting the k–z redundant units, selected in the test phase by a value of the p address bits, at most $U=2^{r-p}$ sets of means for storing the locations of the faults affecting the base units and the z redundant units, selected during the test phase by the same value of the p address bits, and u from among the r address bits other than the p address bits ($u=r-p$).

* * * * *

UNITED STATES PATENT AND TRADEMARK OFFICE
CERTIFICATE OF CORRECTION

PATENT NO. : 7,073,102 B2 Page 1 of 1
APPLICATION NO. : 10/286686
DATED : July 4, 2006
INVENTOR(S) : Michael Nicolaidis It is certified that error appears in the above-identified patent and that said Letters Patent is hereby corrected as shown below:

Title Page #73 On the first page of the Patent, the Assignee Name, which reads "LROC Technologies", should read as follows:

-- iROC TECHNOLOGIES --

Signed and Sealed this

Twenty-eighth Day of November, 2006

JON W. DUDAS
*Director of the United States Patent and Trademark Office*